United States Patent [19]
Lyon et al.

[11] Patent Number: 5,485,466
[45] Date of Patent: Jan. 16, 1996

[54] METHOD AND APPARATUS FOR PERFORMING DUAL SCAN PATH TESTING OF AN ARRAY IN A DATA PROCESSING SYSTEM

[75] Inventors: Jose A. Lyon; Tony Cheng; Anthony M. Reipold; Eric Hoang, all of Austin, Tex.

[73] Assignee: Motorola, Inc., Schaumburg, Ill.

[21] Appl. No.: 131,227

[22] Filed: Oct. 4, 1993

[51] Int. Cl.$^6$ .................................................. G06F 17/00
[52] U.S. Cl. ............................................................. 371/22.3
[58] Field of Search .............................. 371/22.3, 23, 24; 364/550, 578

[56] References Cited

U.S. PATENT DOCUMENTS

| | | | |
|---|---|---|---|
| 4,707,833 | 11/1987 | Tamaru | 371/15 |
| 4,733,405 | 3/1988 | Shimizume et al. | 377/29 |
| 4,876,704 | 10/1989 | Ozaki | 377/70 |
| 4,897,838 | 1/1990 | Tateishi | 371/22.3 |
| 5,043,986 | 8/1991 | Agrawal et al. | 371/22.3 |
| 5,048,021 | 9/1991 | Jarwala et al. | 371/22.3 |
| 5,329,471 | 7/1994 | Swoboda et al. | 364/578 |
| 5,333,139 | 7/1994 | Sturges | 371/22.3 |
| 5,355,369 | 10/1994 | Greenbergerl, Jr. et al. | 371/22.3 |
| 5,381,420 | 1/1995 | Henry | 371/22.3 |

OTHER PUBLICATIONS

Eytan Hartung, Mike Gladden and Oded Yishay, "A Dual Pass Scan Mechanism for Minimizing Serial Scan Outputs", Jul. 1981, Motorola Technical Developments, vol. 13, pp. 14–15.

J. Lyon, M. Gladden, E. Hartung, E. Hoang, and K. Raghunathan, "Testability Features of the 68HC16Z1", 1991 IEEE Intl. Test Conference on Oct. 28, 1991; submitted after Jul. 16, 1991; pp. 5–6.

Dilip K. Bhavsar, "A New Economical Implementation for Scannable Flip–Flops in MOS", Jun. 1986, IEEE Design & Test, pp. 52–56.

Grady Giles, "Scan Path to Inject or Read Out Microcode", Oct. 1985, Motorola Technical Developments, vol. 5, p. 53.

Primary Examiner—Ellis B. Ramirez
Attorney, Agent, or Firm—Elizabeth A. Apperley

[57] ABSTRACT

A data processing system (10) implements state machine (82) and register logic (80) such that no external control or data is required during execution of a dual scan path test operation. Prior to execution of the dual scan path test operation, a user of data processing system (10) initializes a system with a plurality of values which will be used during execution of the dual scan path test operation. After initialization, data processing system (10) executes the dual scan path test operation automatically and requires no additional information from the user.

12 Claims, 9 Drawing Sheets

| TIME PERIOD | CONTENTS OF THE SCANNING SENSE AMPS (SSA) | | | | | | | | SCAN DATA OUTPUT |
|---|---|---|---|---|---|---|---|---|---|
| | SSA 52a | SSA 52b | SSA 52c | SSA 52d | SSA 52e | SSA 52f | SSA 52g | SSA 52h | |
| 1 | a | b | c | d | e | f | g | h | →h |
| 2 | a | a | c | c | e | e | g | g | |
| 3 | 0 | a | a | c | c | e | e | g | →g |
| 4 | 0 | 0 | a | a | c | c | e | e | |
| 5 | 0 | 0 | 0 | a | a | c | c | e | →e |
| 6 | 0 | 0 | 0 | 0 | a | a | c | c | |
| 7 | 0 | 0 | 0 | 0 | 0 | a | a | c | →c |
| 8 | 0 | 0 | 0 | 0 | 0 | 0 | a | a | |
| 9 | 0 | 0 | 0 | 0 | 0 | 0 | a | a | →a |
| 10 | 0 | 0 | 0 | 0 | 0 | 0 | a | a | |

| TIME PERIOD | CONTENTS OF THE SCANNING SENSE AMPS (SSA) | | | | | | | | SCAN DATA OUTPUT |
|---|---|---|---|---|---|---|---|---|---|
| | SSA 52a | SSA 52b | SSA 52c | SSA 52d | SSA 52e | SSA 52f | SSA 52g | SSA 52h | |
| 11 | a | b | c | d | e | f | g | h | →h |
| 12 | a | b | c | d | e | f | g | h | |
| 13 | 0 | b | b | d | d | f | f | h | →h |
| 14 | 0 | 0 | b | b | d | d | f | f | |
| 15 | 0 | 0 | 0 | b | b | d | d | f | →f |
| 16 | 0 | 0 | 0 | 0 | b | b | d | d | |
| 17 | 0 | 0 | 0 | 0 | 0 | b | b | d | →d |
| 18 | 0 | 0 | 0 | 0 | 0 | 0 | b | b | |
| 19 | 0 | 0 | 0 | 0 | 0 | 0 | b | b | →b |
| 20 | 0 | 0 | 0 | 0 | 0 | 0 | b | b | |

METHOD AND APPARATUS FOR PERFORMING DUAL SCAN PATH TESTING OF AN ARRAY IN A DATA PROCESSING SYSTEM

CROSS REFERENCE TO RELATED APPLICATION

This application is related to a commonly assigned patent application filed on Mar. 26, 1992, and entitled: "A METHOD AND APPARATUS FOR SCAN TESTING AN ARRAY IN A DATA PROCESSING SYSTEM" by Michael E. Gladden et al., Ser. No. 07/857,878.

FIELD OF THE INVENTION

This invention relates generally to a data processing system, and more particularly to performing dual scan path testing of an array in the data processing system.

BACKGROUND OF THE INVENTION

Structured arrays in data processing systems are generally tested using a scan path test methodology to provide a high level of controllability and observability during the testing operation. The scan path test methodology uses a serial shifting path to communicate test data between the array or logic circuit being tested and a test circuit.

In structured arrays, such as programmable logic arrays, random access memory, read only memory, and other array type structures, a sense amplifier is normally used to perform a bit line sensing function for each output of the array. In a data processing system which uses the scan path test methodology, each of the sense amplifiers provided for an array is followed by a master/slave test latch which is used to support scan path testing. Each of the master/slave test latches are coupled together to form a shift register structure which is used only during testing operations. The shift register structure is not used during normal operation of the data processing system.

The scan path testing methodology uses a following set of steps to verify the functionality of an associated array. In a first step, an input stimulus is provided to the array and the array is enabled. In a second step, each sense amplifier is enabled to sense the state of its corresponding output from the array. The state is subsequently stored in the associated master/slave test latch. In a third step, the master test latch shifts the output data into *the corresponding slave test latch. The slave test latch then shifts the output data into an adjacent master test latch in the same direction in a fourth step. The last slave test latch does not shift to a master test latch, but shifts the data onto a serial data path which leads to the test circuitry. The test circuitry may be located on or off of the integrated circuit. The third and fourth steps are repeated until all of the output data has been shifted to the test circuitry via the serial data path. The procedure is then repeated using a different input stimulus.

The example described above is one implementation of the scan path testing methodology. Other implementations do exist in which the function of the master test latch is performed by a sense amplifier such that circuitry required to test the integrated circuit is minimized. Such implementations of the scan path testing methodology are well known in the data processing art. Furthermore, in each implementation, test circuitry requires the use of slave test latches. Such slave test latches still require circuit area which is used only for testing purposes.

A dual scan path testing methodology has been developed which provides a more silicon efficient approach to the scan path testing methodology. In the dual scan path testing methodology, alternate latches are allowed to overwrite the data stored in the next adjacent latch. Thus, during a first scan test of the array outputs, the original data from the even latches is overwritten and the original data from the odd latches is scanned out via the serial data path. During a second scan test of the array outputs, the original data from the Odd latches is overwritten and the original data from the even latches is scanned out.

The dual scan path testing methodology described herein uses a sense amplifier to perform the single required latching function. The sense amplifier serves as a master or slave latch depending on which scan pass is performed. During the first pass, the odd outputs are scanned out with the corresponding odd sense amplifiers serving as the master portion of the shifter and the even sense amplifiers serving as the slave portion of the shifter. Conversely, during the second pass, the even outputs are scanned out with the corresponding even sense amplifiers serving as the master portion of the shifter and the odd sense amplifiers serving as the slave portion of the shifter. By using the sense amplifiers in addition to the dual scan path testing methodology, testing of an array in an integrated circuit may be performed using a minimal amount of both circuitry and power consumption.

The dual scan path testing methodology is typically implemented in an integrated circuit through a software program which is written and controlled externally. The software is repeated for each vector which is to be tested. While the dual scan path testing methodology reduces the amount of circuitry required to test an array in the integrated circuit, the software overhead required to implement the dual scan path testing methodology requires a significant number of clock cycles to process the appropriate software program.

SUMMARY OF THE INVENTION

The previously mentioned needs are fulfilled with the present invention. Accordingly, there is provided, in a first form, a data processing system. The data processing system includes a data array for providing a plurality of data outputs in response to an input stimulus and a scan data value. A scan test circuit is connected to the data array for receiving the plurality of data outputs and for providing serial test data in response to the plurality of data outputs. The data processing system also includes a test module for providing both the input stimulus and the scan data input to the data array. A stimulus output of the test module is connected to a stimulus input of the data array. The test module includes a first shift register for storing the scan data value. The first shift register provides the scan data value in response to a first enable signal. The test module also includes a repetition register for storing the scan data value during a first mode of operation of the data processing system and for storing a vector count value during a second mode of operation. The repetition register stores one of the scan data value and the vector count value in response to a second enable signal. The repetition register is connected to the first shift register for receiving the scan data value and is connected to an external interface for receiving the vector count value. The test module also includes a control register for storing a plurality of control values. The plurality of control values is used to determine when the data processing system is operating in one of the first and second modes of operation. The test module also includes a state machine for providing the first and second enable signals in response to at least one of the plurality of control values. The state machine enables the test module to provide the scan data input to the data array during both a first period of time and a second period of time when the data processing system is operating in the first mode of operation.

Similarly, there is provided, in a second form, a method of serially scanning data from an array in a data processing system. The method includes the steps of storing a shift count value in a shift count register, storing a wait value in a distributed register, and storing a first data value in a master shift register. A first mode value is stored in a first control register. The first mode value initializes a state machine to automatically control performance of the method of serially scanning data from the array. The first data value is stored in a repetition register in response to a first control signal provided by the state machine. The first data value is shifted from the master shift register to the array. The array in the data processing system is enabled to execute a first scan path test operation using the first data value. A toggle value is tested to determine if the toggle value is equal to a first predetermined value. The first data value stored in the repetition counter is transferred to the master shift register when the toggle value is equal to the first predetermined value. The array in the data processing system is enabled to execute a second scan path test operation using the first data value.

These and other features, and advantages, will be more clearly understood from the following detailed description taken in conjunction with the accompanying drawings. It is important to note the drawings are not intended to represent the only form of the invention.

DETAILED DESCRIPTION OF A PREFERRED EMBODIMENT

During a following description of the implementation of the invention, the terms "assert" and "negate," and various grammatical forms thereof, are used to avoid confusion when dealing with a mixture of "active high" and "active low" logic signals. "Assert" is used to refer to the rendering of a logic signal or register bit into its active, or logically true, state. "Negate" is used to refer to the rendering of a logic signal or register bit into its inactive, or logically false state.

In order to reduce test circuitry, the present invention uses a dual scan path test scheme for scan testing an array-type structure. The dual scan path test scheme uses a shifting scheme that only requires a minimum of one latching function per output signal.

In the new shifting scheme, alternate latches are allowed to overwrite the data stored in the next adjacent latch. Thus, during a first scan test of the array outputs, the original data from the even latches is overwritten and the original data from the odd latches in scanned out. And during a second scan test of the array outputs, the original data from the odd latches is overwritten and the original data from the even latches in scanned out. In alternate embodiments of the present invention, the original data from the even latches could be scanned out first. The latches are connected in a series-connected chain with the last latch providing an output signal that can be used to determine if the array has malfunctioned. By "even" latches is meant the second, fourth, sixth, and other even numbered latches. And by "odd" latches is meant the first, third, fifth, and other odd numbered latches.

The present invention provides a data processing system which performs an automatic dual scan path test operation which does not require an external software program after initialization by a user of the data processing system. A combination of added states in a state machine and a small amount of additional circuitry enable the data processing system to automatically perform the dual scan path test operation without requiring the user to interface with the data processing system after an initialization process. Operation of the data processing system as well as an explanation of the initialization process will be described in more detail herein.

DESCRIPTION OF CONNECTIVITY

Figure 1:
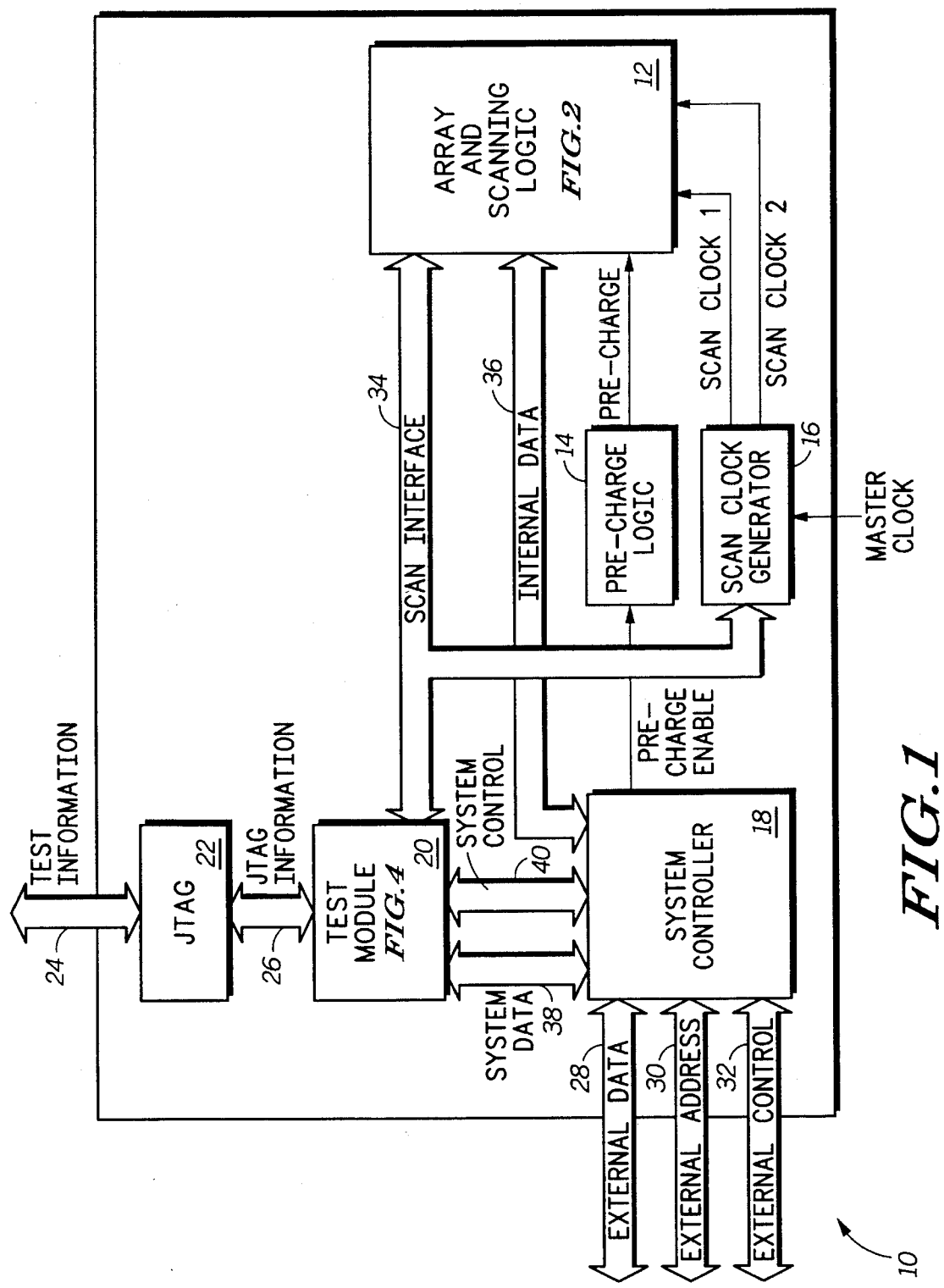
FIG. 1 illustrates, in block diagram form, a data processing system in accordance with one embodiment of the present invention.

FIG. 1 illustrates a data processing system 10 having array and scanning logic 12, a pre-charge logic circuit 14, a scan clock generator 16, a system controller 18, a test module 20, and a JTAG circuit 22. A plurality of Test Information integrated circuit pins 24 are connected to JTAG circuit 22. JTAG circuit 22 is bidirectionally coupled to test module 20 via a JTAG Information bus 26. Test module 20 is coupled to array and scanning logic 12 and scan clock generator 16 via a Scan Interface bus 34. Test module 20 is coupled to system controller 18 via a System Data bus 38 and a System Control bus 40. System controller 18 receives data via a plurality of External Data integrated circuit pins 28. Similarly, system controller 18 receives address and control information via a plurality of External Address integrated circuit pins 30 and a plurality of External Control integrated circuit pins 32, respectively. System controller 18 is coupled to array and scanning logic 12 via an Internal Data bus 36. Additionally, system controller 18 is coupled to pre-charge logic circuit 14 via a Pre-Charge Enable signal. An output of pre-charge logic circuit 14 is coupled to array and scanning logic 12 to provide a Pre-charge signal thereto. Scan clock generator 16 receives a Master Clock signal from an external source. The Master Clock signal is typically provided via a dedicated integrated circuit pin, but may also be provided by an on chip integrated within the data processing system. Scan clock generator 16 provides a Scan Clock 1 signal and a Scan Clock 2 signal to array and scanning logic 12.

Figure 2:
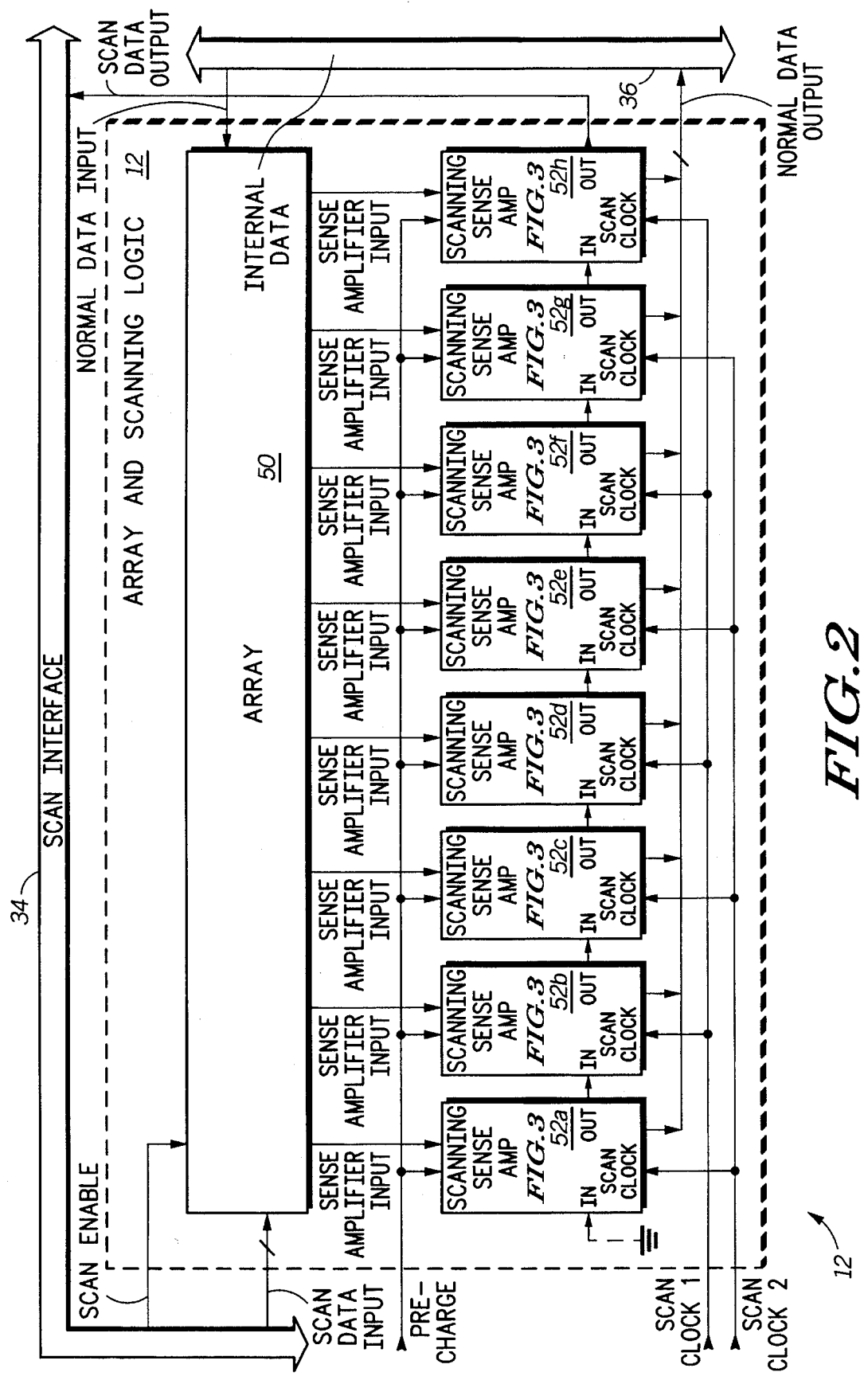
FIG. 2 illustrates, in block diagram form, array and scanning logic of FIG. 1.

FIG. 2 illustrates array and scanning logic 12 in more detail. Array and scanning logic 12 generally includes an array 50 and a plurality of scanning sense amplifiers, 52a through 52h. Array 50 receives Scan Enable and Scan Data Input as input signals. Array 50 generates one Sense Amplifier Input signal for each scanning sense amplifier (52a–52h). Each scanning sense amplifier (52a-52h) also receives the Pre-charge signal as an input. Scanning sense amplifiers 52b, 52d, 52f, and 52h each receives Scan Clock 1 as a Scan Clock input signal. Scanning sense amplifiers 52a, 52c, 52e, and 52g each receive Scan Clock 2 as a Scan Clock input signal. Each scanning sense amplifier (52a–52h) generates a signal which is output from the array and scanning logic 12 as Normal Data Output.

Scanning sense amplifier 52a can receive an input signal labeled In from another scanning sense amplifier (not shown) or from another circuit (not shown). In the illustrated embodiment, the In input to scanning sense amplifier 52a is simply connected to ground. Scanning sense amplifier 52a generates an output signal Out, which is received by scanning sense amplifier 52b as an input signal labeled In. Scanning sense amplifier 52b generates an output signal Out, which is received by scanning sense amplifier 52c as an input signal labeled In. Scanning sense amplifier 52c generates an output signal Out, which is received by scanning sense amplifier 52d as an input signal labeled In.

Likewise, scanning sense amplifier 52d generates an output signal Out, which is received by scanning sense amplifier 52e as an input signal labeled In. Scanning sense amplifier 52e generates an output signal Out, which is received by scanning sense amplifier 52f as an input signal labeled In. Scanning sense amplifier 52f generates an output signal Out, which is received by scanning sense amplifier 52g as an input signal labeled In. Scanning sense amplifier 52g generates an output signal Out, which is received by scanning sense amplifier 52h as an input signal labeled In. Finally, scanning sense amplifier 52h generates an output signal Out, which is transferred outside of the array and scanning logic 12 as Scan Data Output.

Figure 3:
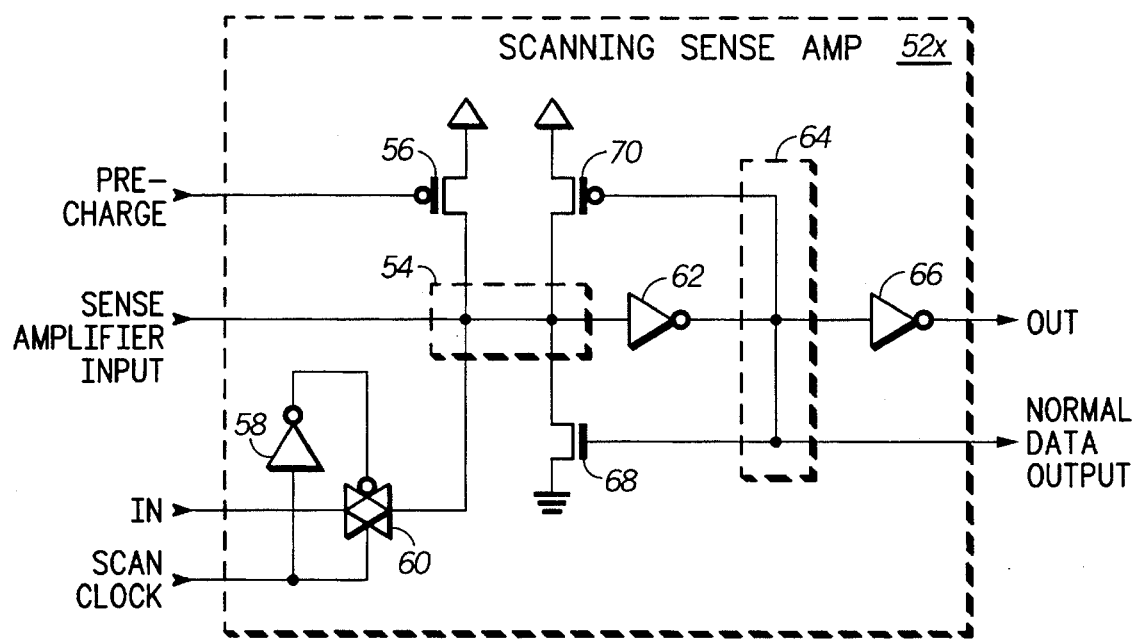
FIG. 3 illustrates, in schematic diagram form, a scanning sense amplifier of FIG. 2.

FIG. 3 illustrates a circuit implementation of one scanning sense amplifier 52x, which could be used as any of the scanning sense amplifiers (52a–52h) of FIG. 2. In is an input signal to a CMOS transmission gate 60. Scan Clock is a control input to the n-channel portion of CMOS transmission gate 60. Scan Clock is an input to inverter 58. The output of inverter 58, Scan Clock, is a control input to the p-channel portion of CMOS transmission gate 60. The output of CMOS transmission gate 60 is coupled to node 54. A p-channel MOS transistor 56 has a first current electrode connected to a positive power supply voltage, a second current electrode connected to node 54, and a control electrode connected to the Pre-charge signal. Node 54 is connected to the Sense Amplifier Input signal and to an input of an inverter 62.

Still referring to FIG. 3, a p-channel MOS transistor 70 has a first current electrode connected to a positive power supply voltage, a second current electrode connected to node 54, and a control electrode connected to a node 64. An output of inverter 62 is also coupled to node 64. An n-channel MOS transistor 68 has a first current electrode connected to ground, a second current electrode connected to node 54, and a control electrode connected to node 64. An input of an inverter 66 is connected to node 64, and an output of inverter 66 is connected to output signal Out. The output signal Normal Data Output is connected to node 64. Transistors 70 and 68 form an inverter which has an input connected to node 64 and an output connected to the input of inverter 62. Inverter 66 is used to invert and buffer the output signal from inverter 62.

Scanning sense amplifier 52x can perform three functions, namely, the function of a sense amplifier, a master test latch for scan testing, and a slave test latch for scan testing. Scanning sense amplifier 52x can only perform one of these functions at a time. Node 54 is the input node to the scanning sense amplifier 52x. Node 54 can do only one of the following at a time: (1) be precharged using transistor 56; (2) receive an input value from array 50 across the Sense Amplifier Input signal; or (3) receive an input value across the In input signal.

Node 54 is precharged high to the voltage of the positive power supply prior to the assertion of the Scan Enable signal. When Scan Enable is asserted, Sense Amplifier Input either leaves node 54 high, or pulls node 54 low to ground. The In input signal is only used during scan testing. When the In input signal is being used, the precharging of node 54 is disabled and the Sense Amplifier Input signal is disabled. When Scan Clock is a binary zero value, the output of transmission gate 60 is tri-stated (i.e. the output of transmission gate 60 is not being driven, but is high impedance).

The feedback path connecting the output of inverter 62 to the inputs of transistors 70 and 68 allows scanning sense amplifier 52x to operate down to a minimum operating frequency of zero Hertz. Alternate embodiments of the present invention could use a dynamic design instead of a static design. A dynamic design of scanning sense amplifier 52x would rely on charge stored on nodes and would require that the operating frequency not drop below a minimum frequency.

Figure 4:
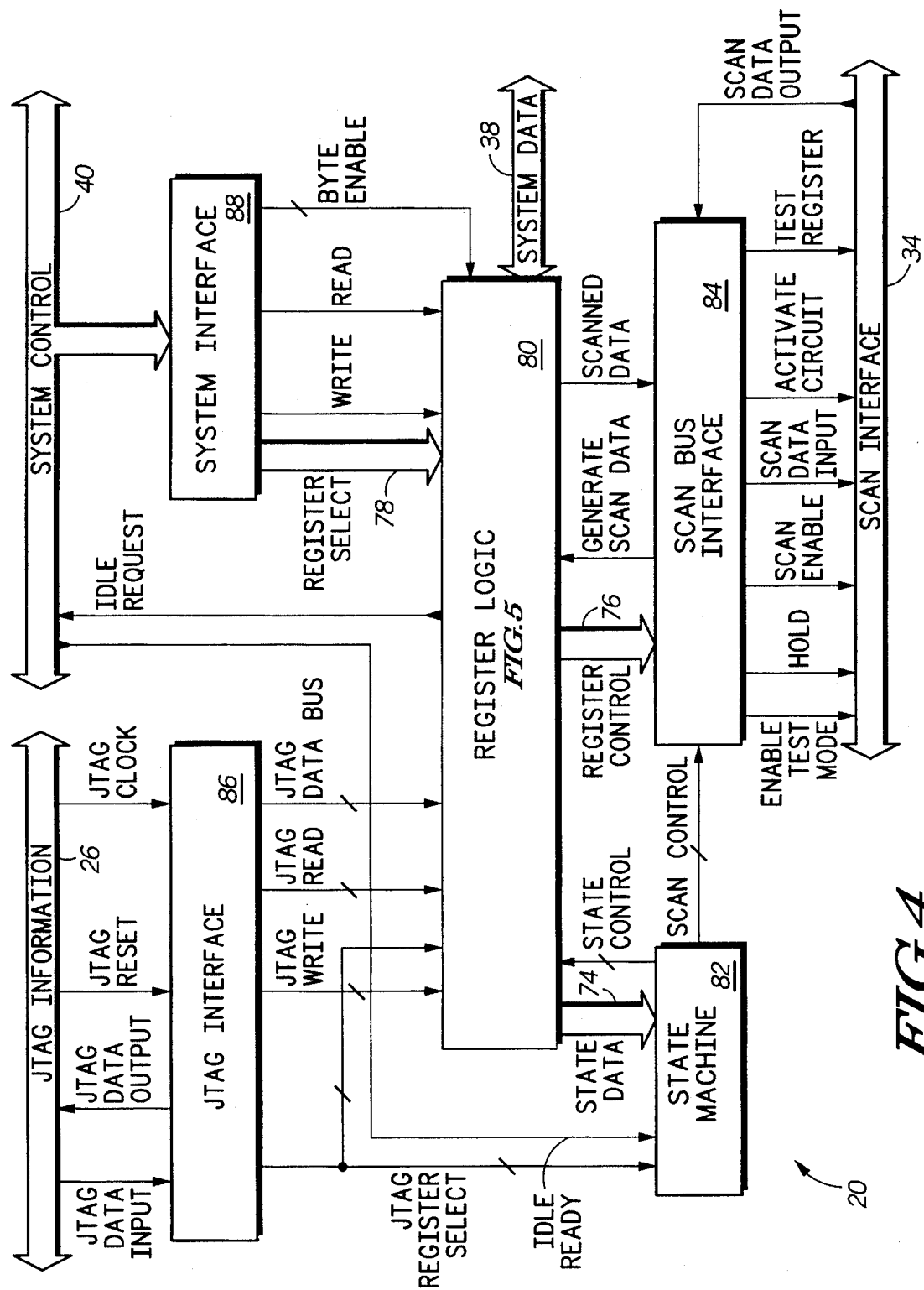
FIG. 4 illustrates, in block diagram form, a test module of FIG. 1 in accordance with one embodiment of the present invention.

FIG. 4 illustrates one embodiment of test module 20. Test module 20 generally comprises a register logic circuit 80, a state machine 82, a scan bus interface 84, a JTAG interface 86, and a system interface 88. JTAG Information bus 26 is coupled to JTAG interface 86 to provide a JTAG Data Input signal, a JTAG Reset signal, and a JTAG Clock signal. JTAG Information bus 26 is also coupled to JTAG interface 86 to receive a JTAG Data Output signal. JTAG interface 86 is coupled to register logic circuit 80 to provide a JTAG Write signal, a JTAG Read signal, and a JTAG Data bus for transferring data. JTAG interface 86 is coupled to each of register logic 80 and state machine 82 to provide a plurality of JTAG Register Select signals.

System Control bus 40 is coupled to system interface 88 to provide a plurality of control signals. System Control bus 40 is also coupled to state machine 82 to provide an Idle Ready signal. System interface 88 is coupled to register logic circuit 80 to provide a plurality of Register Select signals 78, a Write signal, a Read signal, and a plurality of Byte Enable signals.

Register logic circuit 80 is coupled to System Control bus 40 to provide an Idle Request signal. Additionally, register logic circuit 80 bidirectionally communicates the plurality of System Data signals 38. Register logic circuit 80 is coupled to state machine 82 to provide a plurality of state data values via a State Data bus 74. As well, state machine 82 provides a plurality of State Control signals to register logic circuit 80. Register logic circuit 80 provides a plurality of register control signals to scan bus interface 84 via a Register Control bus 76. Additionally, register logic circuit 80 provides a Scanned Data signal to scan bus interface 84 and receives a Generate Scan Data signal from scan bus interface 84.

Scan bus interface 84 is coupled to state machine 82 to receive a plurality of Scan Control signals. Scan bus interface 84 is also coupled to Scan Interface bus 34 to provide an Enable Test Mode signal, a Hold signal, a Scan Enable signal, an Activate Circuit signal, a Test Register signal, and a Scan Data Output signal. Scan Interface bus 34 also transfers a Scan Data Input signal to scan bus interface 84.

Figure 5:
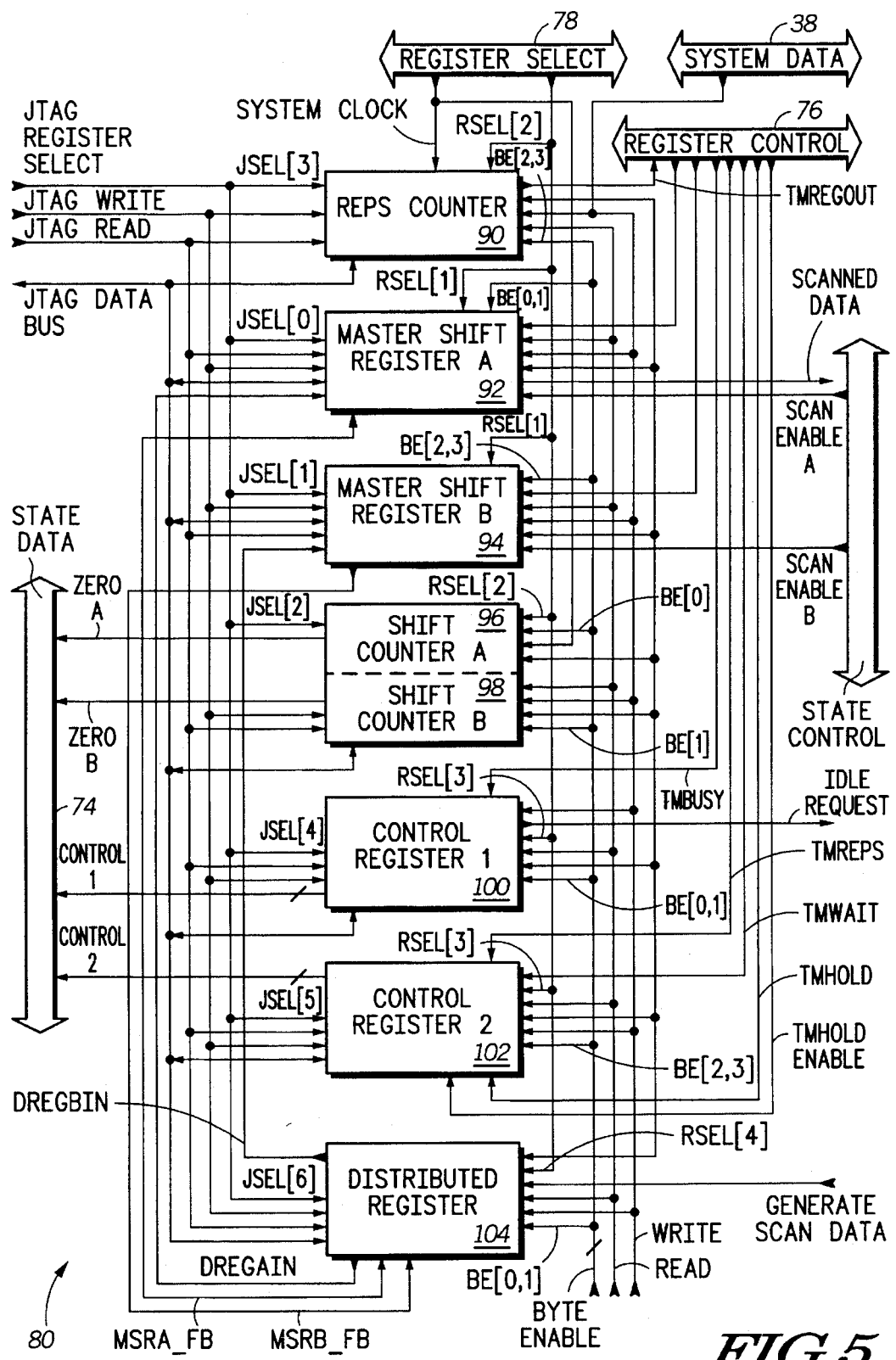
FIG. 5 illustrates, in partial block diagram form, a register logic circuit of FIG. 4 in accordance with one embodiment of the present invention.

FIG. 5 illustrates register logic circuit 80 of the data processing system. Register logic circuit 80 generally includes a reps counter 90, a master shift register A 92, a master shift register B 94, a shift counter A 96, a shift counter B 98, a control register 1 100, a control register 2 102, and a distributed register 104. Register Select bus 78 provides a RSEL [2] signal to reps counter 90, shift counter A 96, and shift counter B 98. Register Select bus 78 provides a RSEL[1] signal to master shift register A 92 and Master shift register B 94. Additionally, Register Select bus 78 provides a RSEL[3] signal to control register 1 100 and control register 2 102. As well, Register Select bus 78 provides a RSEL[4] signal to distributed register 104. System Data bus 38 provides data to each of reps counter 90, master shift register A 92, master shift register B 94, shift counter A 96, shift counter B 98, control register 1 100, control register 2 102, and distributed register 104.

Reps counter 90 provides a TMREGOUT (test mode register output) signal to Register Control bus 76. Register Control bus 76 provides a TMBUSY (test mode busy) signal to control register 1 100 and a TREPS (test mode repetitions) signal to control register 2 102. Register Control bus 76 also provides a TWAIT (test mode wait) signal, TMHOLD (test mode hold) signal, and a TMHOLD Enable (test mode hold enable) signal to control register 2 102.

Master shift register A 92 provides the Scanned Data signal to scan bus interface 84 (of FIG. 4). The plurality of State Control signals provide a Scan Enable A signal to master shift register A 92 and a Scan Enable B signal to master shift register B 94. Control register 1 100 provides the Idle Request signal to System Control bus 40 (of FIG. 4). The Generate Scan Data is provided to distributed register 104. The Read signal provided by system interface 88 is provided to each of reps counter 90, master shift register A 92, master shift register B 94, shift counter A 96, shift counter B 98, control register 1 100, control register 2 102, and distributed register 104. Similarly, the Write signal provided by system interface 88 is provided to each of reps counter 90, master shift register A 92, master shift register B 94, shift counter A 96, shift counter B 98, control register 1 100, control register 2 102, and distributed register 104. The plurality of Byte Enable signals provide a BE[0,1] signal to distributed register 104 and a BE[2,3] signal to control register 2 102. The BE[0,1] signal is also provided to control register 1 100 and master shift register A 92. The BE[2,3] signal is also provided to reps counter 90 and master shift register B 94. The plurality of Byte Enables signals also provides a BE[1] signal to shift counter B 98 and a BE[0] signal to shift counter A 96.

The plurality of JTAG Register Select signals provides a JSEL[3] signal to reps counter 90 and a JSEL [0] signal to master shift register A 92. The plurality of JTAG Register Select signals provides a JSEL[1] signal to master shift register B 94. A JSEL[2] signal is provided to both shift counter A 96 and shift counter B 98. The plurality of JTAG Register Select signals provides a JSEL[4] signal and a JSEL[5] signal to control register 1 100 and control register 2 102, respectively. A JSEL[6] signal is provided to distributed register 104 via the plurality of JTAG Register Select signals.

The JTAG Write signal is provided to each of reps counter 90, master shift register A 92, master shift register B 94, shift counter A 96, shift counter B 98, control register 1 100, control register 2 102, and distributed register 104. The JTAG Read signal is also provided to each of reps counter 90, master shift register A 92, master shift register B 94, shift counter A 96, shift counter B 98, control register 1 100, control register 2 102, and distributed register 104. The JTAG Data bus provides data to each of reps counter 90, master shift register A 92, master shift register B 94, shift counter A 96, shift counter B 98, control register 1 100, control register 2 102, and distributed register 104.

State Data bus 74 is coupled to both shift counter A 96 to receive a Zero A signal and shift counter B 98 to receive a Zero B signal. Control register 1 100 is coupled to State Data bus 74 to provide a plurality of Control 1 signals. Similarly, control register 2 102 is coupled to State Data bus 74 to provide a plurality of Control 2 signals. Master shift register B is also coupled to distributed register 104 to provide a MSRB_FB signal and to receive a DREGBIN signal. Similarly, master shifter register A is coupled to distributed register 104 to provide a MSRA_FB signal and to receive a DREGAIN signal.

GENERAL DESCRIPTION OF OPERATION

The present invention implements state machine 82 and register logic 80 such that no external control or data is required during execution of the dual scan path test operation. Prior to execution of the dual scan path test operation, a user of data processing system 10 initializes a system with a plurality of values which will be used during execution of the dual scan path test operation. Each of the plurality of values will subsequently be discussed in more detail. After initialization, data processing system 10 executes the dual scan path test operation automatically and requires no additional information from the user of data processing system.

As part of the present implementation of the dual scan path test operation, the present invention requires that the same Scan Data Input signals be used during each iteration of the dual scan path test methodology. The Scan Data Input signals are stored in master shift register A 92 during a first iteration of the dual scan path test. A copy of the Scan Data Input signals is stored in reps counter 90. During a second iteration of the dual scan path test, the contents of reps counter 90 are automatically transferred to master shift register A 92. The same Scan Data Input signals are, therefore, used during both the first and second iterations of the dual scan path test. Control of data processing system 10 during the dual scan path testing operation is provided by state machine 82 of test module 20 such that the same Scan Data Input signals are used during the first and second iterations of the dual scan path test methodology without requiring user intervention.

Figures 6, 7:
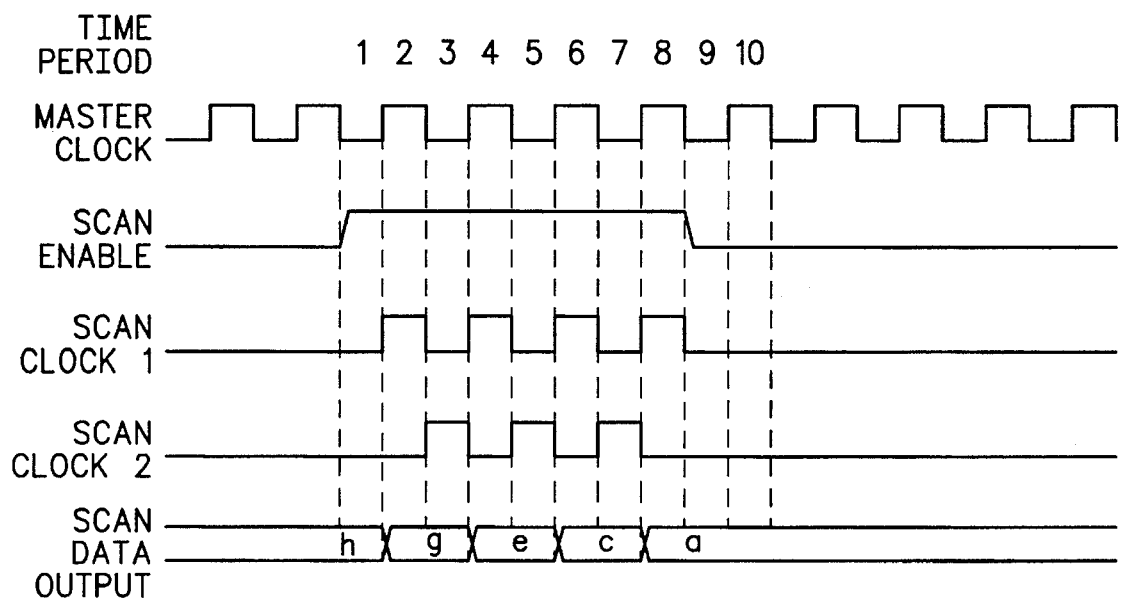
FIG. 6 illustrates, in timing diagram form, time periods and waveforms used in one embodiment of the present invention.
FIG. 7 illustrates, in tabular form, the contents of scanning sense amplifiers of FIG. 2 at different time periods in accordance with one embodiment of the present invention.
Figures 8, 9:
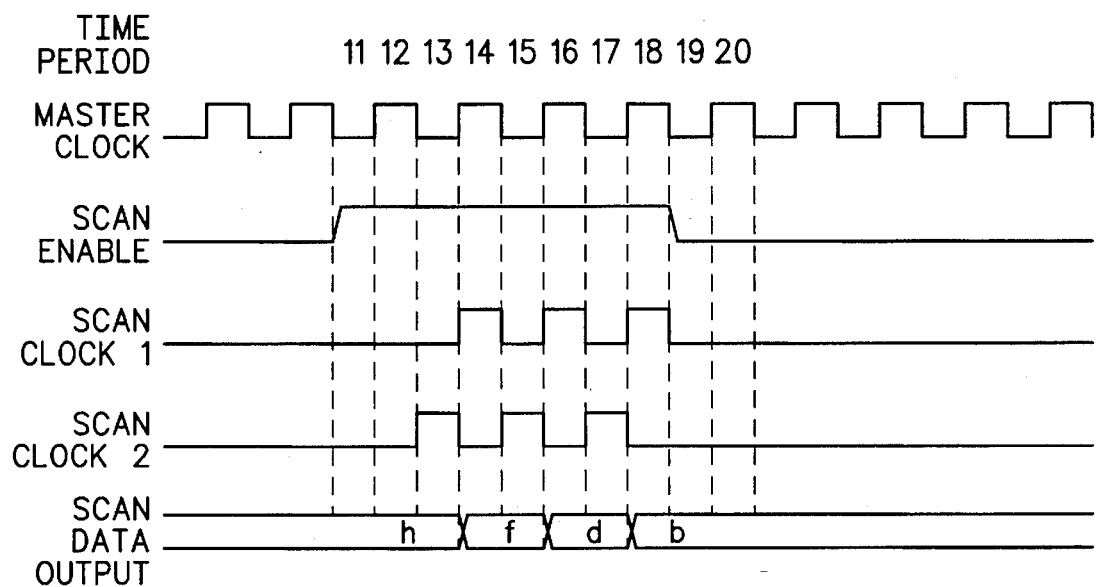
FIG. 8 illustrates, in timing diagram form, time periods and waveforms used in one embodiment of the present invention.
FIG. 9 illustrates, in tabular form, the contents of scanning sense amplifiers of FIG. 2 at different time periods in accordance with one embodiment of the present invention.

Before a more detailed explanation of the operation of data processing system 10, execution of the dual scan path testing operation will be briefly explained. During execution of the dual scan path testing operation, the first application of the Scan Data Input signals results in the events that occur during time periods 1 through 10 as illustrated in FIG. 6 and FIG. 7. The second application of the same Scan Data Input signals results in the events that occur during time periods 11 through 20 as illustrated in FIG. 8 and FIG. 9.

FIG. 6 illustrates a timing diagram of several time periods and waveforms used in one embodiment of the present invention. The time periods are labeled 1 through 10. The Master Clock and Scan Enable signals are the signals used to generate Scan Clock 1 and Scan Clock 2. In the present embodiment, the Scan Enable signal is used to indicate that the data processing system 10 is in a test mode and that the scan testing of array 50 is currently being performed.

The letters contained within each of the Scan Data Output bits represent the location of the scanning sense amplifier 52x which was the origin of that particular Scan Data Output bit. The original content of each scanning sense amplifier 52x is the Sense Amplifier Input value received from the array 50. The original content of each scanning sense amplifier 52x is represented by the letter "x". For example, the original content of scanning sense amplifier 52a is represented by the letter "a". And the original content of scanning sense amplifier 52h is represented by the letter "h". In the present embodiment, the contents "x" of each scanning sense amplifier 52x is a single binary bit of information, either a binary zero or a binary one.

FIG. 7 is a table illustrating the value of both the Scan Data Output signal and the contents of the eight scanning sense amplifiers (52a–52h) of FIG. 2 at the time periods 1 through 10 shown in FIG. 6. The first column, labeled "Time Period", corresponds to the time periods I through 10 illustrated in FIG. 6. The second column, labeled "Contents of the Scanning Sense Amps (SSA)", illustrates how the contents of the eight scanning sense amplifiers (52a–52h) change during the different time periods. And the third column, labeled "Scan Data Output", corresponds to the value of the Scan Data Output signal that is shifted out of scanning sense amplifier 52h during the different time periods.

FIG. 8 illustrates a timing diagram of several time periods and waveforms used in one embodiment of the present invention. The time periods are labeled 11 through 20. The Master Clock and Scan Enable signals are used to generate Scan Clock 1 and Scan Clock 2. In the present embodiment, the Scan Enable signal is used to indicate that the data processing system 10 is in a test mode and that the scan testing of array 50 is currently being performed.

FIG. 9 is a table illustrating the value of both the Scan Data Output signal and the contents of the eight scanning sense amplifiers (52a–52h) of FIG. 2 at the time periods 11 through 20 shown in FIG. 6. The first column, labeled "Time Period", corresponds to the time periods 11 through 20 illustrated in FIG. 6. The second column, labeled "Contents of the Scanning Sense Amps (SSA)", illustrates how the contents of the eight scanning sense amplifiers (52a–52h) change during the different time periods. And the third column, labeled "Scan Data Output", corresponds to the value of the Scan Data Output signal that is shifted out of scanning sense amplifier 52h during the different time periods.

The dual scan path testing operation of the present invention will now be briefly described. The purpose of testing an array is to ensure that the array produces the correct outputs for a given set of inputs. Array 50 is tested by applying various stimuli to the array 50 by way of the Scan Data Input signals, and by enabling the array using the Scan Enable signal. The array 50 then produces output signals that are received by the scanning sense amplifiers (52a–52h) across the Sense Amplifier Input signals. The information stored in the scanning sense amplifiers (52a–52h) is serially transmitted across the Scan Data Output signal during testing, while requiring a minimum of circuitry.

In order for the array 50 to be properly tested, the original contents of each of the scanning sense amplifiers (52a–52h) must be scanned out using the Scan Data Output signal. In order to scan out the original contents of each of the scanning sense amplifiers (52a–52h), the present invention requires that the same Scan Data Input signals be applied to array 50 twice. The first application of the stimulus results in the events that occur during time periods I through 10 as illustrated in FIG. 6 and FIG. 7. During time periods 1 through 10, the Scan Data Output signal scans out the original contents of scanning sense amplifiers 52h, 52g, 52e, 52c, and 52a.

The second application of the same stimulus results in the events that occur during time periods 11 through 20 as illustrated in FIG. 8 and FIG. 9. During time periods 11 through 20, the Scan Data Output signal scans out the original contents of scanning sense amplifiers 52h, 52h, 52f, 52d, and 52b. Thus, at the end of time period 20, the original contents of each of the scanning sense amplifiers (52a–52h) have been scanned out at least once.

The primary difference between time periods 1 through 10 and time periods 11 through 20 arises because of the Scan Clock 1 and Scan Clock 2 signals. In time periods I through 10, Scan Clock 1 is asserted first and is asserted four times. Whereas in time periods 11 through 20, Scan Clock 2 is asserted first and is asserted only three times. As a result, the original values "h", "g", "e", "c", and "a" are scanned out during time periods 1 through 10, whereas the original values "h", "h", "f", "d", and "b" are scanned out during time periods 11 through 20.

Thus by the end of time periods 1 through 20, the original values from all eight scanning sense amplifiers (52a–52h) have been transferred across the Scan Data Output signal via Scan Interface bus 34. Test module 20 subsequently receives the Scan Data Output signal. Test module 20 may use the data scanned out from array 50 in order to determine if array 50 has malfunctioned.

INITIALIZATION OF THE DATA PROCESSING SYSTEM FOR PERFORMING THE DUAL PASS SCAN PATH TEST OPERATION AUTOMATICALLY

To execute the steps listed above, data processing system 10 must first be initialized to operate in the dual scan path mode of operation. As shown in FIG. 1, data processing system 10 may be initialized with data received via the Test Information bus 24 or via the External Data bus 28.

If a state machine in system controller 18 is idled to be tested using the dual scan path test methodology, test and initialization information is provided to JTAG circuit 22 of data processing system 10 via Test Information bus 24. The JTAG test methodology is well known in the data processing art and follows an industry standard specification (I.E.E.E. Std. 1149.1). In an application which will not be discussed in detail herein, but which is well known in the data processing art, the JTAG test information may also be used to test the connections between integrated circuit pins of different integrated circuits for customer specific applications. As this application is not pertinent to the present invention, it will not be discussed in further detail.

The data provided via Test Information bus 24 generally includes a test mode select input, a test data input, a test data output, a test clock input, and a test reset input. The test mode input signal is provided to set a mode of operation of JTAG circuit 22. JTAG circuit 22 may operate in several modes to perform different functions. For example, a manual scan mode may be provided to allow a user of data processing system 10 to "single step" through a group of scan vectors to perform the dual scan pass operation. While the manual scan mode is provided as an example, the present invention provides a next mode of operation of test module 20. The present invention provides an automatic dual scan pass mode in which a series of scan path test may be run, and the results accumulated without the need for intervention by the user. Once the user performs all necessary initialization, as will be subsequently described, state machine 82 will provide the remaining control for loading a plurality scan vectors into a circuit under test, activating the circuit under test, and extracting the results of the dual scan pass operation. Furthermore, it should be understood that any number of modes may be implemented in data processing system 10. Such modes are well known in the data processing art.

The test data input signal is used to transfer the test data to JTAG circuit 22. The test data input generally includes the value to be scanned in during the dual scan pass operation. The test data output signal is used to provide the results of the dual scan pass operation to the user of data processing system 10. The test clock input provides a clock for JTAG circuit 22 and the test reset input provides a reset input to JTAG circuit 22.

JTAG circuit 22 processes each of the test mode select input, the test data input, the test data output, the test clock input, and the test reset input to provide a plurality of signals via JTAG Information bus 26. As shown in FIG. 4, the plurality of signals include the JTAG Data Input signal, the JTAG Data Output signal, the JTAG Reset signal, and the JTAG Clock signal. The JTAG Data Input signal provides data input to a remaining portion of test module 20 and JTAG Data Output signal provides scanned data from test module 20. The JTAG Reset signal is asserted to reset JTAG interface 86 and the JTAG Clock signal provides a clock signal for clocking data in and out of JTAG interface 86.

JTAG interface 86 processes the JTAG Data Input, JTAG Reset, and JTAG Clock signals to provide the plurality of JTAG Register Select signals, the JTAG Write signal, the JTAG Read signal, and the JTAG Data bus to register logic 80.

Referring to FIG. 5, when the plurality of JTAG Register Select signals asserts the JSEL[3] signal, reps counter 90 is enabled to write or read a test value provided by the JTAG Data bus. Reps counter 90 stores the test value transferred via the JTAG Data bus when the JTAG Write signal is asserted and transfers the test value to the JTAG Data bus when the JTAG Read signal is asserted. Similarly, when the plurality of JTAG Register Select signals asserts the JSEL[0] signal, master shift register A 92 is enabled to write or read a test value provided by the JTAG Data bus. The JTAG Data bus writes the test value to master shift register A 92 when the JTAG Write signal is asserted and reads the test value from master shift register A 92 when the JTAG Read signal is asserted. When the plurality of JTAG Register Select signals asserts the JSEL[1] signal, master shift register B 94 is enabled to write or read a test value provided by the JTAG Data bus. The JTAG Data bus writes the test value to master shift register B 94 when the JTAG Write signal is asserted and reads the test value from master shift register B 94 when the JTAG Read signal is asserted. As well, when the plurality of JTAG Register Select signals asserts the JSEL[2] signal, shift counter A 96 and shift counter B 98 are enabled to write or read a test value provided by the JTAG Data bus. The JTAG Data bus writes the test value to shift counter A 96 and shift counter B 98 when the JTAG Write signal is asserted and reads the test value from each of shift counter A 96 and shift counter B 98 when the JTAG Read signal is asserted. Furthermore, when the plurality of JTAG Register Select signals asserts the JSEL[4] signal, control register 1 100 is enabled to store a test value when the JTAG Write signal is asserted and is enabled to provide the test value when the JTAG Read signal is asserted. Similarly, when the plurality of JTAG Register Select signals asserts the JSEL[5] signal, control register 2 102 is enabled to store a test value when the JTAG Write signal is asserted and is enabled to provide the test value when the JTAG Read signal is asserted. When the JSEL[6] signal is asserted, distributed register 104 is enabled to store the test value when the JTAG Read signal is asserted and to provide the test value to the JTAG Data bus when the JTAG Write signal is asserted.

It should be noted that test module 20 may be initialized with information provided by both JTAG circuit 22 and by system controller 18. In a first example, assume that test module 20 is initialized using information provided by JTAG circuit 22. By initializing the registers using test data provided via JTAG circuit 22, the registers may then be used to execute the dual scan pass operation. Initialization and the values stored in each of the registers of register logic 80 will be discussed after a description of a second type of interface used to provide data such that data processing system is able to perform the dual scan pass test operation.

While test data is provided via JTAG circuit 22 when state controller 18 is scan tested, test data is provided via system interface 88 during other situations in which system controller 18 is not idled for scan path testing. In these other situations, external data, address, and control information necessary to perform the scan path testing operation is provided by an external source via External Data bus 28, External Address bus 30, and External Control bus 32, respectively.

System controller 18 processes the external data, address, and control information to provide system data and system control information via the System Data bus 38 and the System Control bus 40. System controller 18 also provides the Pre-Charge Enable signal to pre-charge logic circuit 14. When the Pre-Charge Enable signal is asserted, pre-charge logic circuit 14 is enabled to provide the Pre-Charge signal to array and scanning logic 12.

The system data and system control information provided to test module 20 via System Data bus 38 and System Control bus 40, respectively, are provided to initialize test module 20 to provide the test control and test data to enable array and scanning logic 12 to perform the dual scan pass test operation.

System Data bus 38 provides values to initialize each of reps counter 90, master shift register A 92, master shift register B 94, shift counter A 96, shift counter B 98, control register 1 100, control register 2 102, and distributed register 104. Register Select bus 78 selects which of reps counter 90, master shift register A 92, master shift register B 94, shift counter A 96, shift counter B 98, control register 1100, control register 2 102, and distributed register 104 is to written to or read from. Each of the plurality of Byte Enable signals is also provided to one of reps counter 90, master shift register A 92, master shift register B 94, shift counter A 96, shift counter B 98, control register 1 100, control register 2 102, and distributed register 104. Byte Enable 2 and Byte Enable 3, collectively labeled BE[2,3], are provided to each of reps counter 90, master shift register B 94, and control register 2 102. Similarly, Byte Enable 0 and Byte Enable 1, collectively labeled BE[0,1], are provided to both master shift register A 92, control register 1 100, and distributed register 104. Byte Enable 0, BE[0], is provided to shift counter A 96, and Byte Enable 1, BE[1], is provided to shift counter B 98.

When the Write signal is asserted, the values provided by the System Data bus 38 are written, and when the Read signal is asserted, the values provided by System Data bus 38 are read. As an example, when the RSEL[2] signal is asserted, BE[2,3] is asserted, and the Write signal is asserted, a data value is written to reps counter 90. If the Read signal had been asserted, the contents of reps counter 90 would be provided to System Data bus 38. Accordingly, each of master shift register A 92, master shift register B 94, shift counter A 96, shift counter B 98, control register 1 100, control register 2 102, and distributed register 104 may be written or read when the appropriate one of the plurality of Register Select signals, the appropriate one of the plurality of Byte Enable signals, and one of the Read and Write signals is asserted.

Each of reps counter 90, master shift register A 92, master shift register B 94, shift counter A 96, shift counter B 98, control register 1 100, control register 2 102, and distributed register 104 may be initialized by data provided by either JTAG interface 86 or system interface 88. Subsequent to the steps of initialization, each of the registers is enabled to perform a specific sequence of operations determined by state machine 82. Depending on the initialized contents of each of reps counter 90, master shift register A 92, master shift register B 94, shift counter A 96, shift counter B 98, control register 1 100, control register 2 102, and distributed register 104, state machine 82 will enable register logic 80 to perform one of a plurality of functions. A list of the values stored in each of reps counter 90, master shift register A 92, master shift register B 94, shift counter A 96, shift counter B 98, control register 1100, control register 2 102, and distributed register 104 will be subsequently provided.

DETAILED DESCRIPTION OF CONTENTS OF THE REGISTER LOGIC

Master Shift Registers

During the initialization steps prior to execution of the dual scan pass operation, master shift register A 92 is enabled to store a scan value which will be scanned to array and scanning logic 12. Master shift register B 94 is configured in accordance with the control signals stored in control register 1 100 and control register 2 102.

Control Registers

Each bit of a first control value stored in control register 1 100 provides is used to configure register logic 80 to perform a certain function. A first bit of the first control value stored in control register 1 indicates whether data processing system 10 should perform a single or a dual scan pass test. The first bit is denoted "DPASS", (dual pass scan enable) and is asserted when data processing system 10 is performing the dual scan pass test.

A second bit of the first control value is denoted "TREG" (test register access). When the TREG control value is asserted, a test register in a module may be accessed. When scanning logic other than a module's test register, the TREG control value is negated. In the example provided herein, the TREG control value is used to configure a module under test to be scanned.

A third bit of the first control value is labeled "ATST" (intermodule bus scan access) and enables interrupt lines (not shown herein) to be configured as scan lines when asserted. Additionally, when the ATST bit is negated and a NAMB bit is asserted, master shift register A 92 is enabled to provide the Scanned Data signal. When the ATST bit is negated, master shift register A 92 is connected to master shift register B 94 to test a shift capability of test module 20.

A fourth bit of the first control value is labeled "NAMB" (non-intermodule bus scan access) and is asserted to provide scan test capabilities to logic connected to Scan Interface bus 34. In the example provided herein, the logic would include array and scanning logic circuit 12. It should be noted that, although not shown herein, other logic may also be connected to Scan Interface bus 34.

A fifth bit of the first control value is labeled "INC" (Auto-decrement Mode). The INC bit is asserted, test module 20 is enabled to operate in auto-decrement mode. In the auto-decrement mode, master shift register A 92 is enabled to generate $2^n$ vector sets, where n is the number of inputs to the circuit under test during the scan path testing operation. In the embodiment of the invention described herein, assume that n equals sixteen. Furthermore, a number of vector sets is generally determined by a user of data processing system 10 during initialization. By using master shift register A 92 to generate the plurality of vector sets, the additional requirement of separate software fault simulation to verify that the pseudo-random numbers generated provided sufficient fault coverage is eliminated.

A sixth bit of the first control value is labeled "ACUTL" (activate circuit under test). When the ACUTL bit is asserted, the circuit to be tested is correspondingly activated. In the embodiment of the invention described herein, the circuit under test is array and scanning logic 12.

A seventh bit of the first control value is denoted "CONT" (start continuous operation). The CONT bit is asserted to continually shift data into master register B 94. When the CONT bit is negated, data is no longer shifted into master register B 94.

An eighth bit is labeled "SHIFT" and is asserted to start a shifting operation in register logic 80.

A ninth bit of the first control value is denoted "SATO" (start automatic test operation). The SATO bit is cleared when the contents of reps counter 90 equal zero. When the SATO bit is asserted, an automatic test operation is begun by test module 20. When the SATO bit is negated, the SHIFT bit is asserted, and the INC bit is negated, a manual mode of operation is executed.

A tenth bit of the first control is labeled "ETM" (enter test mode) and indicates that test module 20 has a test mode of operation enabled. However, the state machine of test module 20 will remain at an Idle state until the SHIFT or SATO bit is asserted.

A BUSY signal is provided to control register 1 100 to indicate whether a test module is busy. The test module is busy when the automatic mode, shifting operation, or continuous operation is in progress. When the BUSY signal is asserted, the test module is busy.

As with control register 1 100, each bit of a second control value stored in control register 2 102 provides is used to configure register logic 80 to perform a certain function. A first bit of the second control value, TREPS (test module reps counter), enables test module 20 to verify the logic of reps counter 90. Upon assertion of the TREPS bit, the System Clock will decrement reps counter 90 once, but no shift activity will occur.

A second bit of the second control value is labeled "TWAIT" (test module wait counter). The TWAIT bit is asserted to enable test module 20 to verify the WAIT counter logic. Upon assertion of the TWAIT signal, the System Clock decrements the WAIT counter once, but no shift activity occurs.

A third bit of the second control value is labeled "TMHOLD" (test module shut off module clocks).. The TMHOLD bit is used to shut off module clocks prior to scan testing.

A fourth bit of the second control value is denoted "TMHOLD ENABLE". The TMHOLD ENABLE signal is used to provide an enable for an external HOLD pin (not shown herein). When the TMHOLD ENABLE signal is asserted and the external HOLD pin (not shown herein) is asserted, module clocks are turned off prior to scan testing. If the TMHOLD ENABLE signals is asserted and the external HOLD pin is negated, module clocks continue to function. When the TMHOLD ENABLE signal is negated, the logic value of the external HOLD pin is not "don't cared" and module clocks continue to function.

Distributed Register

Distributed register 104 stores a third control value which is used to configure each of master shift register A 92 and master shift register B 94 to perform one of a pseudo-random number generation or a normal shift operation. Additionally, a portion of the third control value is used to access each of the upper three bits of each of master shift register A 92, master shift register B 94, and a wait counter preset value.

The wait counter preset value includes three bits which are used to program the delay time between automatic test sequences. The next shifting operation of the dual scan pass test operation does not begin until the delay period is over. In the preferred embodiment of the invention, the preferred delay time may vary between two and sixteen clock cycles.

The upper three bits of master shift register A 92 are also stored in distributed register 104. The three bits are only used when a MSRAC bit has been asserted. The MSRAC bit is also stored in distributed register 104 and indicates that master shift register A 92 is configured as a nineteen bit serial pattern generator when it is asserted. When the MSRAC bit is negated, master shift register A 92 is configured as a sixteen bit shift register.

The upper three bits of master shift register B 94 are also stored in distributed register 104. The three bits are only used when a MSRBC bit has been asserted. The MSRBC bit is also stored in distributed register 104 and indicates that master shift register B 94 is configured as a nineteen bit serial signature analyzer when it is asserted. When the MSRBC bit is negated, master shift register B 94 is configured as a sixteen bit shift register.

Shift Counters

In the preferred embodiment of the invention, shift counter A 96 is an eight bit shift register which can be read and written. Shift counter A 96 is initialized to zero after being reset. A shift counter register A (not shown) is included as part of shifter counter A 96. The shift counter register A stores a shift count A value. The shift count A value is used to determine the number of stimulus bits shifted from master shift register A 92 to the module under test for each shifting operation. When a shifting operation begins, the value in shift count register A is loaded into shift counter A 96. Shift counter A 96 is decremented for each bit shifted out of master shift register A 92 during a scan pass test operation. Each bit is shifted out of master shift register A 92 at a rate determined by the System Clock. While shift counter A 96 has a non-zero value, the scan clocks (Scan Clock 1 and Scan Clock 2) are enabled. When shift counter A 96 is equal to zero, test module 20 will perform the following steps if test module 20 is not operating in the dual-pass scan mode:

1. Shift counter A 96 stops decrementing;
2. Master shifter register A 92 stops shifting out stimulus data;
3. If the ATST bit is asserted and the NAMB bit is negated, then the scan clocks are disabled;
4. If the NAMB is asserted and the ATST bit is negated, then the Scan Enable signal is disabled.

If the dual-pass scan is enabled, after the first shift activity has completed, master shift register A 92 and shift counter A 96 are reloaded in preparation for the second pass, which will start automatically and is controlled by state machine 82.

Shift counter B 98 is an eight bit shift register which may be both read and written. Shift counter B 98 is loaded by a shift counter register B (not shown) and is initialized to zero upon reset.

A value loaded into shift counter register B determines a number of response bits which are shifted from the module under test to master shift register B 94 for each shifting operation. When a shifting operation begins, the value in shift counter register B is loaded into shift counter B 98. Shift counter B 98 is decremented for each bit shifted into master shift register B 94, which occurs at the System Clock rate. When the shift counter B 98 reaches zero, and test module 20 is not operating in dual-pass mode, the following events will occur:

1. Shift counter B 98 stops decrementing;
2. Master shift register B 94 stops shifting in response data;
3. If the ATST bit is asserted and the NAMB bit is negated, the scan clocks are disabled; and
4. If the NAMB bit is asserted and the ATST bit is negated, the Scan Enable signal is disabled.

If the dual pass scan is enabled, after the first shift activity has occurred during the first scan pass, then shift counter B 98 will be reloaded in preparation for a second scan pass which will start automatically.

Reps Counter

In the embodiment of the invention described herein, reps counter 90 is implemented as a sixteen bit down counter that determines a number of pseudo-random/auto-decrement vectors which are generated in the automatic mode of operation. In the manual mode of operation, reps counter 90 is not used. During automatic mode for executing the dual scan pass test operation, reps counter 90 is decremented for every second vector shifted out.

To perform the dual pass scan path testing as specified by the preferred embodiment of the present invention, control register 1 100 must assert and provide both the ACUTL bit and the Idle Request signal to a circuit being tested. In the embodiment of the invention described herein, the circuit being tested is array and scanning logic 12. When array and scanning logic 12 is idled by the user, the DPASS bit stored in control register 1 100 is asserted, and the SATO bit stored in control register 1 100 is subsequently asserted, the automatic dual pass scan path testing operation will begin. When the SATO, SHIFT, TWAIT, TREP, OR ACUTL bits are asserted, state machine 82 will exit its Idle state. Subsequently, the TM_BUSY signal is asserted. When state machine 82 reverts to the Idle state, the TM_BUSY signal is negated.

Each of shift counter A 96 and shift counter B 98 is then loaded with a data value which indicates a number of stimuli to be provided to array and scanning logic 12 during the dual pass scan path testing operation. As was previously discussed, the data values are provided to test module 20 via System Data bus 38. Distributed register 104 is also loaded with a wait value which will be used to determine a time period which must elapse between test sequences.

Furthermore, during initialization, a seed value for generating a pseudo-random number is stored in master shift register A 92. The pseudo-random number is used to provide the Scanned Data signal. The pseudo-random number is also stored in reps counter 90 such that the number used in the first iteration of the dual scan path test operation may be used again in the second iteration of the dual pass scan path test operation.

Additionally, the TMHOLD and TMHOLD ENABLE bits are asserted in control register 2 102 during the dual pass scan path test operation.

To begin execution of the dual pass scan path test operation, the SATO bit in control register 1100 is asserted.

EXECUTION OF THE DUAL PASS SCAN PATH TEST OPERATION

Figure 10:
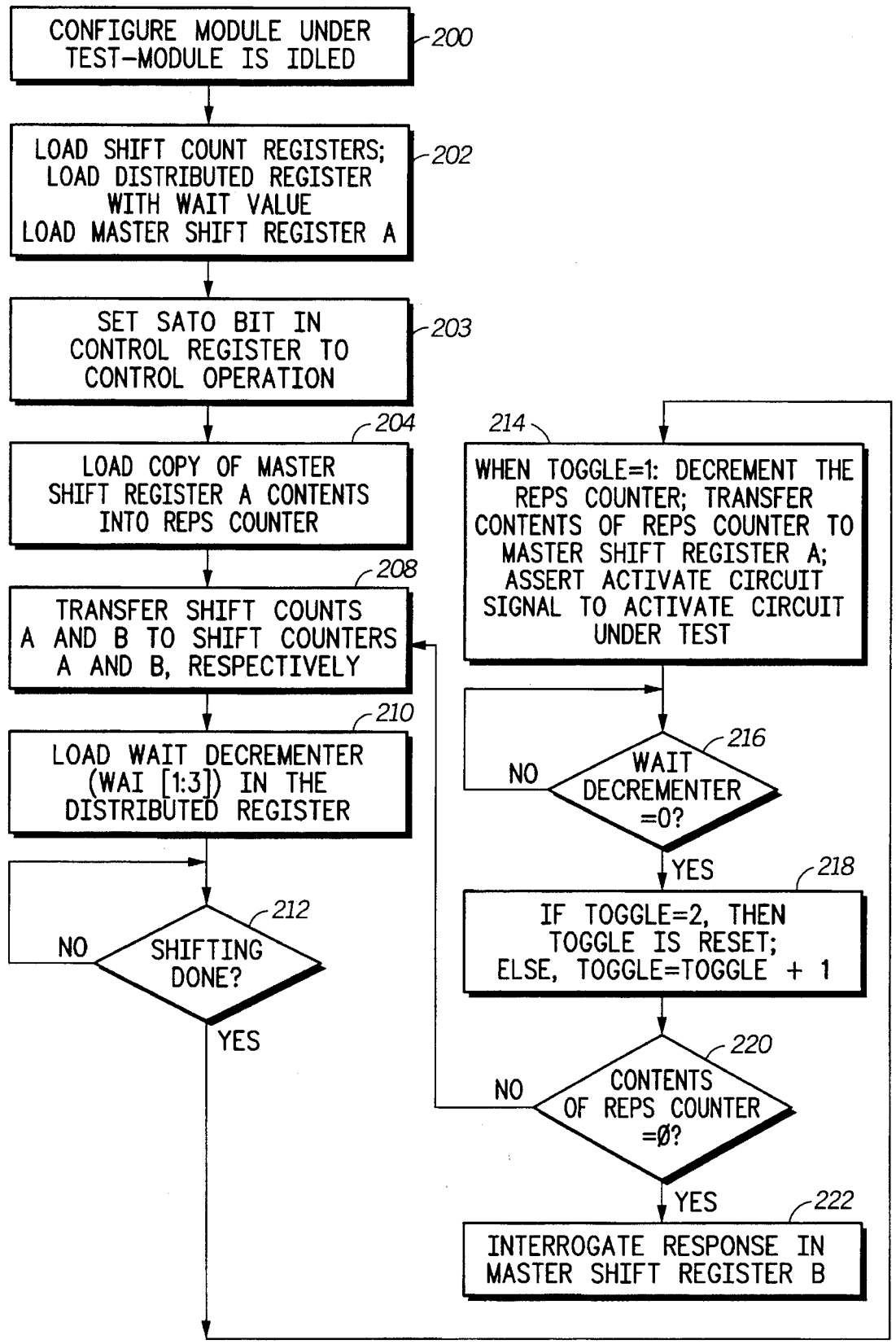
FIG. 10 illustrates, in flow chart form, a flow chart of an automatic dual scan path test operation in the data processing system of FIG. 1 in accordance with one embodiment of the present invention.

FIG. 10 illustrates a flow chart of the steps executed by test module 20 during the dual pass scan path test operation. In a first step 200, the module under test is configured to perform the dual pass scan path test operation. The clocks of the module under test are turned off and the module is effectively idled.

In step 202, the shift count registers associated with shift counter A 96 and shift counter B 98 are each loaded with a shift count value which indicates a number of bits to be shifted from master shift register A 92 to the module under test and the number of bits to be shifted from the module under test to master shift register B 94. Remember, in the embodiment of the invention described herein, the module under test is array and scanning logic 12. While each of the shift count registers is being loaded, the wait value is loaded in distributed register 104. As was previously mentioned, the wait value indicates a number of clock cycles which should pass between execution of automatic test sequences. Master shift register A 92 is also loaded with a seed value to be provided during a first iteration of the dual pass scan path test operation. As was previously mentioned, the seed value is provided to master shift register A 92 by System Data bus 38. Subsequently, the SATO bit is asserted in control register 1 100 (step 203).

In step 204, the seed value is shifted out of master shift register A 92 via System Data bus 38 and provided to reps counter 90. Reps counter 90 stores the seed value so that it may be used in a second iteration of the dual scan pass scan path test operation. Subsequently, in step 208, the shift count values are loaded from the associated shift count registers to a corresponding one of shift counter A 96 and shift counter B 98. Similarly, a wait decrementer (not shown) associated with distributed register 104 is loaded with the wait value stored in distributed register 104.

When the SHIFT bit is asserted and the TMBUSY signal is asserted, state machine 82 asserts the Scan Enable A signal. The Scan Enable A signal is provided to master shift register A 92 by the State Control bus. Upon receipt of the Scan Enable A signal, master shift register A 92 shifts the seed value stored therein by a number of bits specified by the shift count value stored in shift counter A 96. After each bit of the seed value is shifted out to array and scanning logic 12 via the Scanned Data signal, the shift count value stored in shift counter A 96 is decremented by one. The seed value is shifted out until the shift count value is equal to zero.

Similarly, when the SHIFT bit is asserted and the TMBUSY signal is asserted, state machine 82 asserts the Scan Enable B signal. The Scan Enable B signal is provided to master shift register B 94 by the State Control bus. Upon receipt of the Scan Enable B signal, master shift register B 94 shifts in a scanned value by a number of bits specified by the shift count value stored in shift counter B 98. After each bit of the scanned value is shifted to master shift register B 94 via Scan Interface bus 34 from array and scanning logic 12 via the Scanned Data signal, the shift count value stored in shift counter B 98 is decremented by one. The scanned value is shifted in until the shift count value is equal to zero.

When each of shift counter A 96 and shift counter B 98 stores a zero (step 212), a Toggle value in a general purpose storage register (not shown) is tested. The Toggle value indicates which iteration of the dual pass scan path test operation is currently being executed. For example, if the Toggle value equals zero, the first iteration of the dual pass scan path test operation is being executed. When the Toggle value equals one, the second iteration of the dual pass scan path test operation is being executed. When the Toggle value equals two, the dual scan pass operation has been executed.

Assume that the Toggle value equals one (step 214). The value stored in reps counter 90 is transferred to master shift register A 92. Subsequently, the value stored in reps counter 90 is decremented by one. After the value stored in reps counter 90 is transferred to master shift register A 92, the Activate Circuit signal is transferred to scan bus interface 83 via the Scan Interface Bus 34. State machine 82 then provides the plurality of Scan Control signals to scan bus interface 84. Scan bus interface 84 then processes the plurality of Scan Control signals to provide the Scan Enable and Scan Data Input signals to array and scanning logic 12.

Upon receipt of each of the Scan Enable and Scan Data Input signals, as well as the Pre-charge, Scan Clock 1, and Scan Clock 2 signals, array and scanning logic 12 performs the dual pass scan path testing operation. The performance of the dual pass scan path testing operation will be subsequently described in more detail.

After activating array and scanning logic 12 to perform the dual pass scan path testing operation, the wait decrementer (not shown) decrements a delay value stored therein (step 216). The wait decrementer decrements the delay value by one during each clock cycle until a specific time count has passed.

At that point, the Toggle value is again tested to determine if it is equal to two. If the Toggle value is equal to two, the Toggle value is reset to a value of zero. The Toggle value is reset to indicate that the dual pass scan path testing operation has performed the second iteration and is complete. If the Toggle value is not equal to two, the Toggle value is incremented by one (step 218).

The contents of reps counter 90 are then tested to determine if a correct number of vectors have been tested using the dual pass scan path testing methodology (step 220). If the contents of reps counter 90 are not equal to zero, more vectors are to be tested, and steps 208 through 218 are repeated. If the contents of reps counter 90 are equal to zero, the value stored in master shift register B 94 is interrogated to determine if the data scanned out of array and scanning logic 12 is correct (step 222).

STATE MACHINE CONTROL DURING THE DUAL SCAN PATH TEST OPERATION

Execution of the flow chart illustrated in FIG. 10 is controlled by state machine 82 of FIG. 4. A state diagram of the function performed by state machine 82 is provided in FIG. 11. In the state diagram, each state of operation is illustrated by a circle.

In an initial Idle state, state machine 82 is not enabled to provide control information to either register logic 80 or scan bus interface 84. State machine 82 controls execution of the automatic dual pass scan path testing operation disclosed herein. State machine 82 begins in an IDLE state. When the following logical equation is satisfied, state machine 82 transitions from the IDLE state to state S4.

$$(SATO+SHIFT) \cdot (\overline{IDLEREQUEST} \cdot \overline{CONT}) \cdot (TDCTA0+TDCTB0) \quad (1)$$

Figure 11:
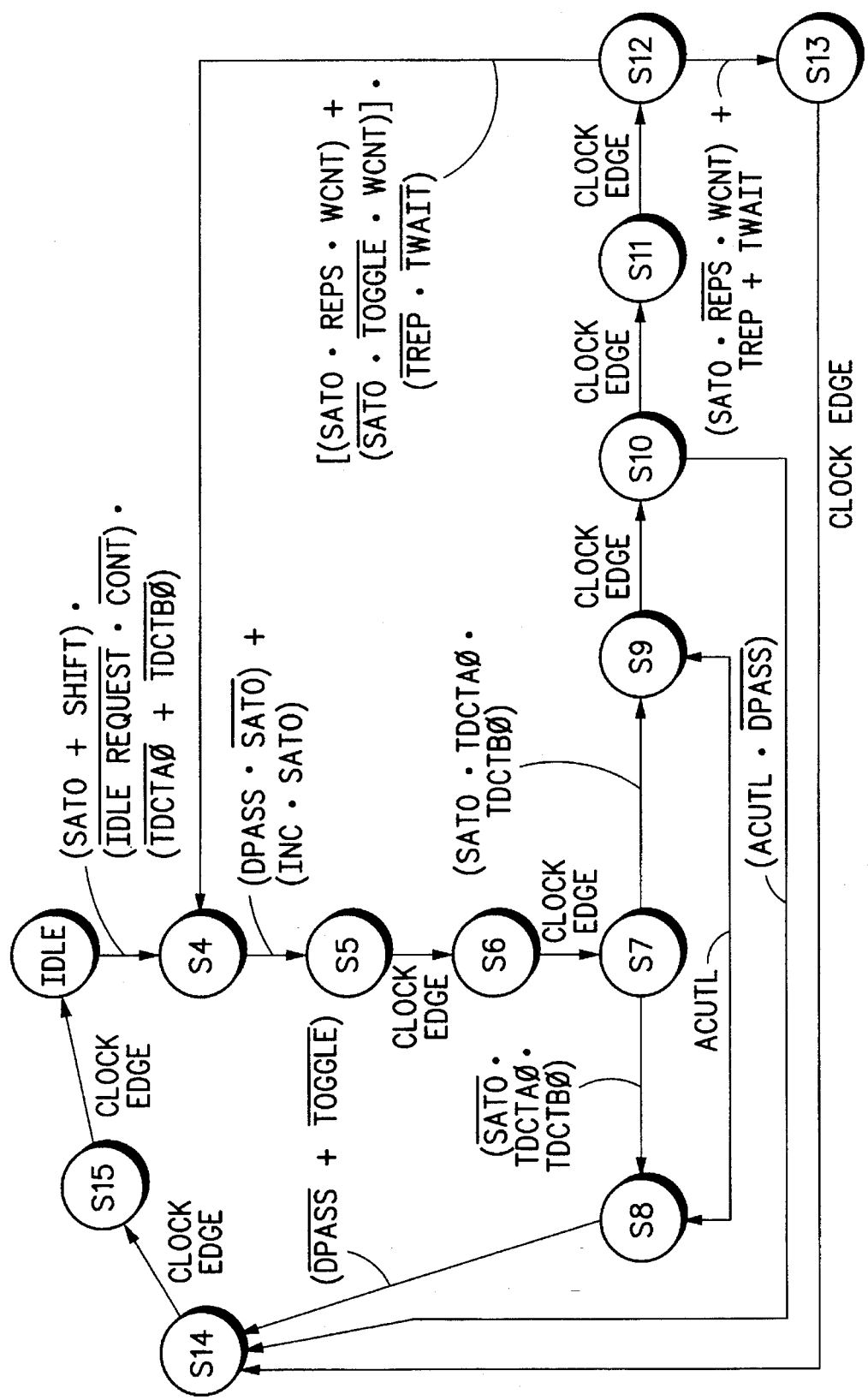
FIG. 11 illustrates, in state diagram form, a state diagram of a function executed by a state diagram of the test module of FIG. 4 during execution of the automatic dual scan path test operation in accordance with one embodiment of the present invention.

The IDLE state of FIG. 11 corresponds to the initialization steps referred to in steps 200, 202, and 204 of the flow diagram illustrated in FIG. 10.

State machine 82 remains in state S4 until the SATO bit or the SHIFT bit is asserted, the IDLE REQUEST and the CONT signals are negated, and at least one of the TDCTA0 and TDCTB0 signals has a positive number stored therein. At least one of the TDCTA0 and the TDCTB0 signals must have a non-zero number stored therein for a shift operation to be performed during execution of the dual pass scan path testing operation.

State machine 82 then transitions from state S4 to S7. The transition from state S4 to state S7 corresponds to steps 208 and 210 of the flow diagram illustrated in FIG. 10. State S7 is a decisional state in which it is determined that test module 20 will operate in an automatic or a manual mode during execution of the dual pass scan path testing operation. State S7 corresponds to step 212 of the flow diagram in FIG. 10. When state S7 transitions to state S9, the automatic mode is being executed and when state S7 transitions to state S8, the manual mode is being executed. To transition from state S7 to state S9, the following equation (2) must be satisfied:

$$(SATO \cdot TDCTA0 \cdot TDCTB0) \quad (2)$$

Similarly, to transition from state S7 to state S8, the following equation (3) must be satisfied:

$$(\overline{SATO} \cdot TDCTA0 \cdot TDCTB0) \quad (3)$$

State machine 82 remains in state S9 until a rising edge of a clock results in a transition to state S10. When the following logical expression (4) provides an asserted result, state machine 82 transitions from state S10 to state S14.

$$ACUTL \cdot \overline{DPASS} \quad (4)$$

Otherwise, at a next clock edge, state machine 82 transitions to state S11. State S11 corresponds to step 216 of the flow diagram illustrated in FIG. 14. State machine 82 transitions to a state S12 on a following clock edge. State S12 corresponds to step 220 of the flow chart illustrated in FIG. 10. State machine 82 transitions from state S12 back to state S4 when the following logical expression (5) generates an asserted result:

$$[(SATO \cdot REPS \cdot WCNT) + (\overline{SATO} \cdot \overline{TOGGLE} \cdot WCNT)] \cdot (TREPS \cdot TWAIT) \quad (5)$$

However, state machine 82 transitions from state S12 to state S13 when the following logical expression (6) generates an asserted result:

$$(SATO \cdot \overline{REPS} \cdot WCNT) + TREPS + TWAIT \quad (6)$$

On a next clock edge, state machine 82 transitions from state S13 to state S14. Similarly, state machine 82 transitions from state S14 to state S15 on the next clock edge. State machine 82 transitions from state S15 to the IDLE state on a subsequent clock edge.

Likewise, when either the SATO bit or the SHIFT bit is asserted, the IDLE REQUEST signal is negated, the CONT bit is negated, and either the TDCTA0 or TDCTB0 bits is negated, state machine 82 transitions from the IDLE state to state S4. As has been previously mentioned, the TDCTA0 and TDCTB0 bits indicate when the contents of each of shift counters A 96 and B 98 are equal to zero, respectively.

If state machine 82 is in state S8 and the ACUTL signal is asserted, state machine 82 transitions from state S8 to state S9. Similarly, state machine 82 transitions from state S8 to state S14 when the following logical expression is satisfied:

$$\overline{DPASS} + TOGGLE \quad (7)$$

THE DUAL PASS SCAN PATH TEST OPERATION

Referring to FIG. 2, FIG. 6, and FIG. 7, the method of scanning during time periods 1 through 10 will now be described. As illustrated in FIG. 7, the scanning sense amplifiers (52a–52h) originally contain the values "a" through "h", respectively, during time period 1. The present embodiment illustrates a data flow from left to right, but alternate embodiments could use a data flow from right to left. During time period 1, the value "h" is driven on the Scan Data Output signal by scanning sense amplifier 52h.

During time period 2, Scan Clock 1 is asserted. As a result, the CMOS transmission gate 60 of each scanning sense amplifier 52b, 52d, 52f, and 52h is enabled and allows the new data received by the In input to be stored. Thus scanning sense amplifiers 52a, 52c, 52e, and 52g shift data into scanning sense amplifiers 52b, 52d, 52f, and 52h. As a result, the values previously stored by the scanning sense amplifiers 52b, 52d, 52f, and 52h are overwritten and lost.

So during time period 2, the present contents of scanning sense amplifier 52a is shifted into scanning sense amplifier 52b. Thus the value "b", which was previously stored in scanning sense amplifier 52b, is overwritten by the value "a". Likewise, the present contents of scanning sense amplifier 52c is shifted into scanning sense amplifier 52d. Thus the value "d", which was previously stored in scanning sense amplifier 52d, is overwritten by the value "c". Likewise, the present contents of scanning sense amplifier 52e is shifted into scanning sense amplifier 52f. Thus the value "f", which was previously stored in scanning sense amplifier 52f, is overwritten by the value "e". And in the same manner, the present contents of scanning sense amplifier 52g is shifted into scanning sense amplifier 52h. Thus the value "h", which was previously stored in scanning sense amplifier 52h, is overwritten by the value "g".

During time period 3, Scan Clock 2 is asserted. As a result, the CMOS transmission gate 60 of each scanning sense amplifier 52a, 52c, 52e, and 52g is enabled and allows the new data received by the In input to be stored. Thus scanning sense amplifiers 52b, 52d, and 52f shift data into scanning sense amplifiers 52c, 52e, and 52g. As a result, the values previously stored by the scanning sense amplifiers 52a, 52c, 52e, and 52g are overwritten and lost. During time period 3, the value "g" is driven on the Scan Data Output signal by scanning sense amplifier 52h. Note that because the In input to scanning sense amplifier 52a is grounded, a binary zero is transferred into scanning sense amplifier 52a.

The overall effect, during time period 3, is that the scanning sense amplifiers (52a–52h) appear to collectively function as a simple shift register, with each scanning sense amplifier (52a–52h) functioning as one bit of the shift register. The value stored in each scanning sense amplifier (52a–52h) appears to be shifted to the right one bit.

In actuality, however, the present contents of scanning sense amplifier 52b is shifted into scanning sense amplifier 52c. Thus the original value "c" stored in scanning sense amplifier 52c is overwritten by the value "a". Likewise, the present contents of scanning sense amplifier 52d is shifted into scanning sense amplifier 52e. Thus the original value "e" stored in scanning sense amplifier 52e is overwritten by the value "c". Likewise, the present contents of scanning sense amplifier 52f is shifted into scanning sense amplifier 52g. Thus the original value "g" stored in scanning sense amplifier 52g is overwritten by the value "e".

During time period 4, the same steps from time period 2 are repeated. Scan Clock 1 is again asserted. As a result, the CMOS transmission gate 60 of each scanning sense amplifier 52b, 52d, 52f, and 52h is enabled and allows the new data received by the In input to be stored. Thus scanning sense amplifiers 52a, 52c, 52e, and 52g shift data into scanning sense amplifiers 52b, 52d, 52f, and 52h. As a result, the values previously stored by the scanning sense amplifiers 52b, 52d, 52f, and 52h are overwritten and lost.

During time period 5, the same steps from time period 3 are repeated. During time period 5, Scan Clock 2 is again asserted. As a result, the CMOS transmission gate 60 of each scanning sense amplifier 52a, 52c, 52e, and 52g is enabled and allows the new data received by the In input to be stored. Thus scanning sense amplifiers 52b, 52d, and 52f shift data into scanning sense amplifiers 52c, 52e, and 52g. As a result, the values previously stored by the scanning sense amplifiers 52a, 52c, 52e, and 52g are overwritten and lost. During time period 5, the value "e" is driven on the Scan Data Output signal by scanning sense amplifier 52h. Note that because the In input to scanning sense amplifier 52a is grounded, a binary zero is again transferred into scanning sense amplifier 52a.

During time period 6, the same steps from time period 2 are repeated. During time period 7, the same steps from time period 3 are repeated, only the value "c" is driven on the Scan Data Output signal by scanning sense amplifier 52h. During time period 8, the same steps from time period 2 are repeated. During time period 9, the same steps from time period 3 are repeated, only the value "a" is driven on the Scan Data Output signal by scanning sense amplifier 52h. During time period 10, no significant changes take place.

At the end of time period 10, the original values from five of the eight scanning sense amplifiers 52a, 52c, 52e, 52g, and 52h have been transferred across the Scan Data Output signal. In order to transfer the original values from the remaining scanning sense amplifiers 52b, 52d, and 52f, the same Scan Data Input must be applied again to array 50. The second application of the same stimulus results in the events that occur during time periods 11 through 20 as illustrated in FIG. 8 and FIG. 9.

Referring to FIG. 2, FIG. 8, and FIG. 9, the method of scanning during time periods 11 through 20 will now be described. As illustrated in FIG. 9, the scanning sense amplifiers (52a–52h) originally contain the values "a" through "h", respectively, during time period 11. During time period 11, the value "h" is driven on the Scan Data Output signal by scanning sense amplifier 52h. During time period 12, no significant changes take place.

During time period 13, Scan Clock 2 is asserted. As a result, the CMOS transmission gate 60 of each scanning sense amplifier 52a, 52c, 52e, and 52g is enabled and allows the new data received by the In input to be stored. Thus scanning sense amplifiers 52b, 52d, and 52f shift data into scanning sense amplifiers 52c, 52e, and 52g. As a result, the values previously stored by the scanning sense amplifiers 52a, 52c, 52e, and 52g are overwritten and lost. During time period 13, the value "h" is again driven on the Scan Data Output signal by scanning sense amplifier 52h. Note that because the In input to scanning sense amplifier 52a is grounded, a binary zero is transferred into scanning sense amplifier 52a.

So during time period 13, the present contents of scanning sense amplifier 52b is shifted into scanning sense amplifier 52c. Thus the value "c", which was previously stored in scanning sense amplifier 52c, is overwritten by the value "b". Likewise, the present contents of scanning sense amplifier 52d is shifted into scanning sense amplifier 52e. Thus the value "e", which was previously stored in scanning sense amplifier 52e, is overwritten by the value "d". And in the same manner, the present contents of scanning sense amplifier 52f is shifted into scanning sense amplifier 52g. Thus the value "g", which was previously stored in scanning sense amplifier 52g, is overwritten by the value "f".

During time period 14, Scan Clock 1 is asserted. As a result, the CMOS transmission gate 60 of each scanning sense amplifier 52b, 52d, 52f, and 52h is enabled and allows the new data received by the In input to be stored. Thus scanning sense amplifiers 52a, 52c, 52e, and 52g shift data into scanning sense amplifiers 52b, 52d, 52f, and 52h. As a result, the values previously stored by the scanning sense amplifiers 52b, 52d, 52f, and 52h are overwritten and lost.

The overall effect, during time period 14, is that the scanning sense amplifiers (52a–52h) appear to collectively function as a simple shift register, with each scanning sense amplifier (52a–52h) functioning as one bit of the shift register. The value stored in each scanning sense amplifier (52a–52h) appears to be shifted to the right one bit.

In actuality, however, the present contents of scanning sense amplifier 52a is shifted into scanning sense amplifier 52b. Thus the value "b", which was previously stored in scanning sense amplifier 52b, is overwritten by the value "0". Likewise, the present contents of scanning sense amplifier 52c is shifted into scanning sense amplifier 52d. Thus the value "d", which was previously stored in scanning sense amplifier 52d, is overwritten by the value "b". Likewise, the present contents of scanning sense amplifier 52e is shifted into scanning sense amplifier 52f. Thus the value "f", which was previously stored in scanning sense amplifier 52f, is overwritten by the value "d". And in the same manner, the present contents of scanning sense amplifier 52g is shifted into scanning sense amplifier 52h. Thus the value "h", which was previously stored in scanning sense amplifier 52h, is overwritten by the value "f".

During time period 15, the same steps from time period 13 are repeated. During time period 5, Scan Clock 2 is again asserted. As a result, the CMOS transmission gate 60 of each scanning sense amplifier 52a, 52c, 52e, and 52g is enabled and allows the new data received by the In input to be stored. Thus scanning sense amplifiers 52b, 52d, and 52f shift data into scanning sense amplifiers 52c, 52e, and 52g. As a result, the values previously stored by the scanning sense amplifiers 52a, 52c, 52e, and 52g are overwritten and lost. During time period 15, the value "f" is driven on the Scan Data Output signal by scanning sense amplifier 52h. Note that because the In input to scanning sense amplifier 52a is grounded, a binary zero is again transferred into scanning sense amplifier 52a.

During time period 16, the same steps from time period 14 are repeated. Scan Clock 1 is again asserted. As a result, the CMOS transmission gate 60 of each scanning sense amplifier 52b, 52d, 52f, and 52h is enabled and allows the new data received by the In input to be stored. Thus scanning sense amplifiers 52a, 52c, 52e, and 52g shift data into scanning sense amplifiers 52b, 52d, 52f, and 52h. As a result, the values previously stored by the scanning sense amplifiers 52b, 52d, 52f, and 52h are overwritten and lost.

During time period 17, the same steps from time period 13 are repeated, only the value "d" is driven on the Scan Data Output signal by scanning sense amplifier 52h. During time period 18, the same steps from time period 14 are repeated. During time period 19, the same steps from time period 13 are repeated, only the value "b" is driven on the Scan Data Output signal by scanning sense amplifier 52h. During time period 20, no significant changes take place.

Thus by the end of time periods 1 through 20, the original values from all eight scanning sense amplifiers (52a–52h) have been transferred across the Scan Data Output signal. The test circuitry (not shown) which receives the Scan Data Output signal compresses the extra repetition of the "h" value received from the scanning sense amplifier 52h. The test circuitry (not shown) can use the data scanned out from array 50 in order to determine if array 50 has malfunctioned.

It is important to note that the present invention does not significantly increase the test time required to test most arrays 20. The amount of time required to drive each data output bit on the Scan Data Output signal remains the same. Because most arrays have tens or hundreds of outputs, the one extra output data bit which is scanned out during each application of the stimulus does not cost very much of the overall test time. And the amount of additional overhead time to apply the same stimulus twice to array 50 is small.

In summation, the above specification describes a method and apparatus for scan testing an array in a data processing system. By using the scanning sense amplifiers (52a–52h) to perform three functions, the circuitry required for scan testing can be reduced. This reduction in circuitry can be made without significantly increasing the test time required to test most arrays. The three functions performed by each of the scanning sense amplifiers (52a–52h) are the function of a sense amplifier, a master test latch for scan testing, and a slave test latch for scan testing.

While the present invention has been illustrated and described with reference to specific embodiments, further modifications and improvements will occur to those skilled in the art. For example, any number of scanning sense amplifiers (52a–52h) could be used, rather than just the eight shown in FIG. 2. Array 50 could be any type of array-type structure. Various circuits could be used to implement the scanning sense amplifiers (52a–52h). Additionally, it should be noted that the order of the first pass and the second pass could be reversed with no effect of the final result.

SUMMARY OF THE PREFERRED EMBODIMENT OF THE INVENTION

The present invention implements state machine 82 and register logic 80 such that no external control or data is required during execution of the dual scan path test operation. Prior to execution of the dual scan path test operation, a user of data processing system 10 initializes a system with a plurality of values which will be used during execution of the dual scan path test operation. Each of the plurality of values is stored in register logic 80 by the user of data processing system 10 prior to execution of the test operation. After initialization, data processing system 10 executes the dual scan path test operation automatically and requires no additional information from the user of data processing system.

As part of the present implementation of the dual scan path test operation, the present invention requires that the same Scan Data Input signals be used during each iteration of the dual scan path test methodology. The Scan Data Input signals are stored in master shift register A 92 during a first iteration of the dual scan path test. A copy of the Scan Data Input signals is stored in reps counter 90. During a second iteration of the dual scan path test, the contents of reps counter 90 are automatically transferred to master shift register A 92. The same Scan Data Input signals are, therefore, used during both the first and second iterations of the dual scan path test. Control of data processing system 10 during the dual scan path testing operation is provided by state machine 82 of test module 20 such that the same Scan Data Input signals are used during each iteration of the dual scan path test methodology without requiring user intervention.

The implementation of the invention described herein is provided by way of example only. However, many other implementations may exist for executing the function described herein. For example, it should be understood that, in addition to the automatic mode of operation described herein, the data processing system may have additional modes of operation. Such additional modes of operation may include a manual mode and a single pass test mode. Furthermore, it should be understood that additional input interfaces may be provided.

While there have been described herein the principles of the invention, it is to be clearly understood to those skilled in the art that this description is made only by way of example and not as a limitation to the scope of the invention. Accordingly, it is intended, by the appended claims, to cover all modifications of the invention which fall within the true spirit and scope of the invention.

We claim:

1. A data processing system, comprising:

a data array for providing a plurality of data outputs in response to an input stimulus and a scan data value;

scan test means for receiving the plurality of data outputs and providing serial test data in response to the plurality of data outputs, the scan test means being coupled to the data array for receiving the plurality of data outputs;

a test module for providing both the input stimulus and the scan data input to the data array, a stimulus output of the test module being coupled to a stimulus input of the data array, the test module comprising:

a first shift register for storing the scan data value, the first shift register providing the scan data value in response to a first enable signal;

a repetition register for storing the scan data value during a first mode of operation of the data processing system and for storing a vector count value during a second mode of operation, the repetition register storing one of the scan data value and the vector count value in response to a second enable signal, the repetition register being coupled to the first shift register for receiving the scan data value and being coupled to an external interface for receiving the vector count value;

a control register for storing a plurality of control values, the plurality of control values being used to determine when the data processing system is operating in one of the first and second modes of operation; and a state machine for providing the first and second enable signals in response to at least one of the plurality of control values, the state machine enabling the test module to provide the scan data input to the data array during both a first period of time and a second period of time when the data processing system is operating in the first mode of operation.

2. The data processing system of claim 1 wherein the scan test means comprises:

a scan clock generator for generating a first scan clock signal and a second scan clock signal; and a plurality of logic elements wherein each of the plurality of logic elements further comprises:
a scan input;
a scan output;
a scan clock input; and
storage means for storing the scan data value present at the scan input when an active signal is present at the scan clock input, the plurality of logic elements being arranged as a series-connected chain with the scan output of each logic element in the series-connected chain, except for a last element of the series-connected chain, connected to the scan input of a subsequent logic element of the series-connected chain, each even numbered logic element in the series-connected chain receiving the first scan clock signal at the scan clock input and each odd numbered logic element in the series-connected chain receiving the second scan clock signal at the scan clock input.

3. The data processing system of claim 1 further comprising:

a second shift register for storing the serial test data during the first mode of operation of the data processing system, the second shift register being coupled to data array for receiving the serial test data.

4. The data processing system of claim 1 further comprising:

a shift register for storing a number of bits of the scan data value to be shifted from the first shift register to the data array; and a shift counter for providing a count output signal to indicate when the number of bits of the scan data value have been shifted to the data array, the first shift register, the shift counter being coupled to the state machine to provide the count output signal.

5. The data processing system of claim 4 wherein the state machine negates the first enable signal when the count output signal is equal to a predetermined value.

6. The data processing system of claim 1 further comprising:

a distributed register for storing a wait value, the wait value being used to provide a programmable delay between execution of a first and a second scan operation by the data processing system.

7. A method of serially scanning data from an array in a data processing system, comprising the steps of:

storing a shift count value in a shift count register;

storing a wait value in a distributed register;

storing a first data value in a master shift register;

storing a first mode value in a first control register, the first mode value initializing a state machine to automatically control performance of the method of serially scanning data from the array;

storing the first data value in a repetition register in response to a first control signal provided by the state machine;

shifting the first data value from the master shift register to the array;

enabling the array in the data processing system to execute a first scan path test operation using the first data value;

testing a toggle value to determine if the toggle value is equal to a first predetermined value;

transferring the first data value stored in the repetition register to the master shift register when the toggle value is equal to the first predetermined value; and enabling the array in the data processing system to execute a second scan path test operation using the first data value.

8. The method of claim 7 wherein the first scan path test operation and the second scan path test operation, comprise the steps of:

enabling the array to communicate a second data value;
storing the second data value in a first latch;
enabling the array to communicate a third data value;
storing the third data value in a second latch;
enabling the array to communicate a fourth data value;
storing the fourth data value in a third latch;
enabling the array to communicate a fifth data value;
storing the fifth data value in a fourth latch;

overwriting the second data value in the first latch with the third data value from the second latch so that the first latch and the second latch both store the third data value;

overwriting the fourth data value in the third latch with the fifth data value from the fourth latch so that the third latch and the fourth latch both store the fifth data value; and overwriting the third data value in the second latch with the fifth data value so that the second latch and the third latch both contain the fifth data value.

9. The method of claim 8 further comprising the step of:

providing the second data value as an output signal prior to said step of overwriting the second data value.

10. The method of claim 9 further comprising the step of:

using the output signal to determine if the data processing system has malfunctioned.

11. The method of claim 9 further comprising the steps of:

providing the third data value as the output signal subsequent to said step of overwriting the second data value; and providing the fifth data value as the output signal subsequent to said step of overwriting the third data value.

12. The method of claim 11 further comprising the steps of:

repeating said step of providing the second data value as the output signal; and providing the fourth data value as the output signal.

* * * * *